United States Patent
Ohi et al.

(10) Patent No.: US 12,191,358 B2
(45) Date of Patent: Jan. 7, 2025

(54) SEMICONDUCTOR DEVICE

(71) Applicant: FUJI ELECTRIC CO., LTD., Kanagawa (JP)

(72) Inventors: Kota Ohi, Matsumoto (JP); Yoshihiro Ikura, Matsumoto (JP); Yosuke Sakurai, Azumino (JP); Mutsumi Kitamura, Matsumoto (JP); Yuichi Onozawa, Matsumoto (JP); Yoshiharu Kato, Matsumoto (JP); Toru Ajiki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 458 days.

(21) Appl. No.: 17/385,974

(22) Filed: Jul. 27, 2021

(65) Prior Publication Data

US 2021/0359088 A1    Nov. 18, 2021

Related U.S. Application Data

(63) Continuation of application No. PCT/JP2020/029879, filed on Aug. 4, 2020.

(30) Foreign Application Priority Data

Aug. 9, 2019   (JP) ................................. 2019-147450

(51) Int. Cl.
*H01L 29/36*   (2006.01)
*H01L 21/265*   (2006.01)
(Continued)

(52) U.S. Cl.
CPC ............ *H01L 29/36* (2013.01); *H01L 21/265* (2013.01); *H01L 27/0716* (2013.01);
(Continued)

(58) Field of Classification Search
CPC .............. H01L 21/265; H01L 27/0727; H01L 29/0603; H01L 29/0619; H01L 29/0696;
(Continued)

(56) References Cited

U.S. PATENT DOCUMENTS 6,482,681 B1   11/2002   Francis
10,176,994 B2   1/2019   Suzuki
(Continued)

FOREIGN PATENT DOCUMENTS

CN   102687277 A   9/2012
JP   2009176882 A   8/2009
(Continued)

OTHER PUBLICATIONS

Office Action issued for counterpart Japanese Application No. 2021-539227, issued by the Japan Patent Office on Sep. 27, 2022 (drafted on Sep. 20, 2022).
(Continued)

*Primary Examiner* — Fazli Erdem

(57) ABSTRACT

Provided is a semiconductor device, including: a drift region of a first conductivity type which is provided in a semiconductor substrate, and a buffer region of the first conductivity type which is provided between the drift region and a lower surface of the semiconductor substrate, and has three or more concentration peaks higher than a doping concentration of the drift region of the semiconductor substrate in a depth direction. Three or more of the concentration peaks includes a shallowest peak closest to the lower surface of the semiconductor substrate, a high concentration peak arranged at an upper side than the lower surface of the semiconductor substrate than the shallowest peak, and one or more low concentration peaks arranged at an upper side than the lower surface of the semiconductor substrate than the high con-
(Continued)

centration peak and of which the doping concentration is ⅕ or less of the high concentration peak.

21 Claims, 16 Drawing Sheets

(51) Int. Cl.
    *H01L 27/07*      (2006.01)
    *H01L 29/10*      (2006.01)
    *H01L 29/739*     (2006.01)
    *H01L 29/861*     (2006.01)
(52) U.S. Cl.
    CPC ...... *H01L 29/1095* (2013.01); *H01L 29/7395* (2013.01); *H01L 29/861* (2013.01)
(58) Field of Classification Search
    CPC ..... H01L 29/0834; H01L 29/32; H01L 29/36; H01L 29/7395; H01L 29/861; H01L 29/26; H01L 29/407; H01L 29/4238; H01L 29/1095; H01L 29/66348; H01L 29/8613; H01L 29/7397
    USPC ......................................................... 257/655
    See application file for complete search history.

(56) References Cited

U.S. PATENT DOCUMENTS

| | | | |
|---|---|---|---|
| 10,229,972 B2 | 3/2019 | Imagawa | |
| 10,304,928 B2 | 5/2019 | Tamura | |
| 10,347,715 B2 | 7/2019 | Suzuki | |
| 10,381,225 B2 | 8/2019 | Mukai | |
| 10,490,646 B2 | 11/2019 | Onozawa | |
| 10,734,230 B2 | 8/2020 | Tamura | |
| 2008/0000125 A1 | 1/2008 | Chang | |
| 2008/0001257 A1* | 1/2008 | Schulze | H01L 29/861 257/E29.2 |
| 2009/0184338 A1 | 7/2009 | Hisamoto | |
| 2012/0267681 A1 | 10/2012 | Nemoto | |
| 2013/0249058 A1 | 9/2013 | Neidhart | |
| 2015/0024556 A1 | 1/2015 | Miyazaki | |
| 2015/0214347 A1 | 7/2015 | Falck | |
| 2016/0197143 A1 | 7/2016 | Naito | |
| 2017/0271450 A1 | 9/2017 | Takahashi | |
| 2017/0294527 A1 | 10/2017 | Suzuki | |
| 2018/0053655 A1 | 2/2018 | Kawase | |
| 2018/0182844 A1 | 6/2018 | Nakamura | |
| 2018/0350902 A1 | 12/2018 | Nemoto | |
| 2018/0366566 A1 | 12/2018 | Suzuki | |
| 2019/0027561 A1 | 1/2019 | Ohi | |
| 2019/0067462 A1 | 2/2019 | Tamura | |
| 2019/0103479 A1 | 4/2019 | Suzuki | |
| 2019/0148500 A1 | 5/2019 | Agata | |
| 2019/0280613 A1 | 9/2019 | Fujii | |
| 2020/0058506 A1 | 2/2020 | Nakamura | |
| 2020/0135847 A1 | 4/2020 | Kiyoi | |
| 2020/0273970 A1 | 8/2020 | Okuda | |
| 2021/0098252 A1* | 4/2021 | Onozawa | H01L 29/7395 |

FOREIGN PATENT DOCUMENTS

| | | | |
|---|---|---|---|
| JP | 2017168776 A | 9/2017 | |
| JP | 2017188569 A | 10/2017 | |
| JP | 2018078216 A | 5/2018 | |
| JP | 2018078314 A | 5/2018 | |
| JP | 2018107303 A | 7/2018 | |
| JP | 2019009148 A | 1/2019 | |
| JP | 2019067890 A | 4/2019 | |
| JP | 2019071503 A | 5/2019 | |
| JP | 2019160853 A | 9/2019 | |
| JP | 2020027921 A | 2/2020 | |
| JP | 2020182009 A | 11/2020 | |
| WO | 2013147275 A1 | 10/2013 | |
| WO | 2015093190 A1 | 6/2015 | |
| WO | 2016051970 A1 | 4/2016 | |
| WO | 2016147264 A1 | 9/2016 | |
| WO | 2016203545 A1 | 12/2016 | |
| WO | 2016204126 A1 | 12/2016 | |
| WO | 2016204227 A1 | 12/2016 | |
| WO | 2017047285 A1 | 3/2017 | |
| WO | 2017146148 A1 | 8/2017 | |
| WO | 2018074434 A1 | 4/2018 | |
| WO | 2018135448 A1 | 7/2018 | |
| WO | 2018207394 A1 | 11/2018 | |
| WO | 2019017034 A1 | 1/2019 | |

OTHER PUBLICATIONS (ISA/237) Written Opinion of the International Search Authority for International Patent Application No. PCT/JP2020/029879, issued/mailed by the Japan Patent Office on Nov. 2, 2020.

Office Action issued for counterpart Chinese Application 202080011718.4, issued by The State Intellectual Property Office of People's Republic of China on Jul. 25, 2024.

* cited by examiner

SEMICONDUCTOR DEVICE

The contents of the following Japanese patent applications are incorporated herein by reference:
NO. 2019-147450 filed in JP on Aug. 9, 2019, and
PCT/JP2020/029879 filed in WO on Aug. 4, 2020

BACKGROUND

1. Technical Field

The present invention relates to a semiconductor device.

2. Related Art

Conventionally, there is known a structure in a semiconductor element such as IGBT (insulated gate bipolar transistor) in which an N+ buffer region is provided below a drift region (for example, see Patent Literature 1).
Patent Literature 1: WO 2013/147275
It is preferable to relax the electric field concentration on the buffer region.

In order to solve the above problem, a semiconductor device is provided in an aspect of the invention. The semiconductor device may include a drift region of a first conductivity type which is provided in a semiconductor substrate. The semiconductor device may include a buffer region of the first conductivity type which is provided between the drift region and a lower surface of the semiconductor substrate, and has three or more concentration peaks higher than a doping concentration of the drift region of the semiconductor substrate in a depth direction. The three or more concentration peaks may include a shallowest peak closest to the lower surface of the semiconductor substrate. The three or more concentration peaks may include a high concentration peak arranged at an upper side than the lower surface of the semiconductor substrate than the shallowest peak. The three or more concentration peaks may include one or more low concentration peaks which are arranged at an upper side than the lower surface of the semiconductor substrate than the high concentration peak and of which the doping concentration is ⅕ or less of the high concentration peak.

The buffer region may have a hydrogen concentration peak corresponding to the concentration peak. The semiconductor device may include a collector region of a second conductivity type which is provided between the buffer region and the lower surface of the semiconductor substrate.

The low concentration peak may be a deepest peak which is arranged farthest from the lower surface of the semiconductor substrate among the concentration peaks.

The three or more concentration peaks may include a deepest peak arranged farthest from the lower surface of the semiconductor substrate, and the low concentration peak may be arranged between the high concentration peak and the deepest peak.

The three or more concentration peaks may include two or more of the low concentration peaks.

The two or more low concentration peaks may be two or more concentration peaks arranged farthest from the lower surface of the semiconductor substrate among the concentration peaks.

The doping concentration of the low concentration peak may be 50 times or less of a bulk donor concentration of the semiconductor substrate.

The doping concentration of the low concentration peak may be 50 times or less of the doping concentration in a center of the semiconductor substrate in the depth direction.

The three or more concentration peaks may include a first peak arranged farthest from the lower surface of the semiconductor substrate, and a second peak adjacent to the first peak in the depth direction. An average value of peak values of the doping concentrations of the first peak and the second peak may be ⅕ times or less of the peak value of the doping concentration of the high concentration peak.

An average value of peak values of the doping concentrations of the first peak and the second peak may be 50 times or less of the bulk donor concentration of the semiconductor substrate.

An average value of peak values of the doping concentrations of the first peak and the second peak may be 50 times or less of the doping concentration in a center of the semiconductor substrate in the depth direction.

The buffer region may include a recombination center. The density peak of the recombination center in the depth direction may be arranged between a shallowest peak and a high concentration peak.

The density peak may be arranged between the shallowest peak and the high concentration peak from the shallowest peak.

The doping concentration of the deepest peak arranged farthest from the lower surface of the semiconductor substrate among the concentration peaks may be 1.1 times or more than the doping concentration of a concentration peak adjacent to the deepest peak in the depth direction, or 5 times or less.

The doping concentration of the deepest peak arranged farthest from the lower surface of the semiconductor substrate among the concentration peaks may be $1.0 \times 10^{14}$ atoms/cm$^3$ or more, or $5.0 \times 10^{14}$ atoms/cm$^3$ or less.

The buffer region may be arranged between the lower surface of the semiconductor substrate and the center of the semiconductor substrate in the depth direction.

The deepest peak arranged farthest from the lower surface of the semiconductor substrate among the concentration peaks may be arranged between the upper surface of the semiconductor substrate and the center of the semiconductor substrate in the depth direction.

The summary clause does not necessarily describe all necessary features of the embodiments of the present invention. The present invention may also be a sub-combination of the features described above.

BRIEF DESCRIPTION OF THE DRAWINGS

FIG. 6 is a diagram illustrating an example of a gate voltage waveform when the semiconductor device 100 of a short-circuit state is turned on.

DESCRIPTION OF EXEMPLARY EMBODIMENTS

Figure 1:
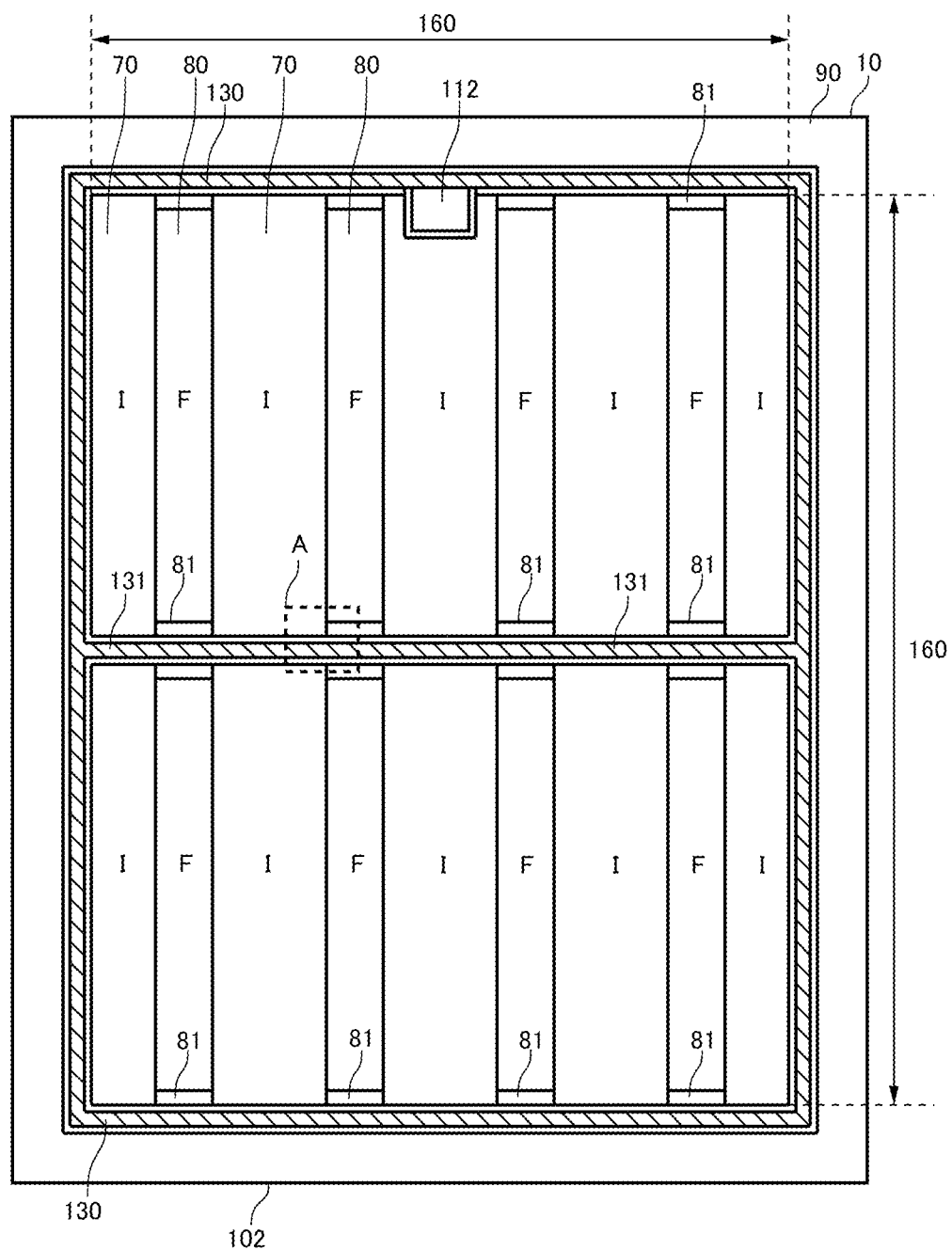
FIG. 1 is an upper view illustrating an example of a semiconductor device 100 according to an embodiment of the invention.

Hereinafter, the invention will be described through embodiments of the invention, but the following embodiments do not limit the invention according to claims. In addition, not all of the combinations of features described in the embodiments are essential to the solving means of the invention.

In the present specification, one side in a direction parallel to the depth direction of a semiconductor substrate is referred to as "upper", and the other side is referred to as "lower". One of the two main surfaces of the substrate, layer, or other members is called an upper surface, and the other surface is referred to as a lower surface. The directions of "up" and "down" are not limited to the direction of gravity or the direction when a semiconductor device is mounted.

In this specification, technical matters may be described using orthogonal coordinate axes of an X axis, a Y axis, and a Z axis. The orthogonal coordinate axis is merely to specify a relative position of components, and is not specified by a specific direction. For example, the Z axis is not limited to a height direction with respect to the ground surface. Further, a +Z axis direction and a −Z axis direction are directions opposite to each other. When the Z axis direction is described without describing the sign, it means that the direction is parallel to the +Z axis and the −Z axis.

In the present specification, the orthogonal axes parallel to the upper surface and the lower surface of a semiconductor substrate are referred to as the X axis and the Y axis. In addition, the axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate, including the X axis and the Y axis, may be referred to as a horizontal direction.

In the present specification, the term "same" or "equal" may include a case where there is an error due to manufacturing variation or the like. The corresponding error is within, for example, 10%.

In the present specification, the conductivity type doping region doped with impurities is described as a P type or an N type. In the present specification, the impurities may particularly mean any of an N type donor and a P type acceptor, and it may be described as a dopant. In the present specification, doping means that a donor or an acceptor is introduced to the semiconductor substrate to form a semiconductor having an N type conductivity or a semiconductor having a P type conductivity.

In the present specification, a doping concentration means the concentration of a donor or the concentration of an acceptor in a thermal equilibrium state. In the present specification, a net doping concentration means a net concentration obtained by adding the donor concentration as the concentration of positive ions to the acceptor concentration as the concentration of negative ions, including the polarities of charges. As an example, when the donor concentration is $N_D$, and the acceptor concentration is $N_A$, the net doping concentration at an arbitrary position becomes $N_D - N_A$. In the present specification, a net doping concentration may be simply described as a doping concentration.

The donor has a function of supplying electrons to the semiconductor. The acceptor has a function of accepting electrons from the semiconductor. The donor and the acceptor are not limited to impurities themselves. For example, a VOH defect caused by a combination of a vacancy (V), an oxygen (O), and a hydrogen (H) existing in the semiconductor functions as a donor to supply electrons. In the present specification, a VOH defect may be called as a hydrogen donor.

In the present specification, the term P+ type or N+ type means that the doping concentration is higher than that of the P type or N type, and the term P− type or N− type means that the doping concentration is lower than that of the P type or N type. In addition, in the present specification, the term P++ type or N++ type means that the doping concentration is higher than that of the P+ type or N+ type.

A chemical concentration in the present specification indicates the concentration of impurities, which is measured regardless of the state of electrical activation. The chemical concentration can be measured by, for example, secondary ion mass spectrometry (SIMS). The above-mentioned net doping concentration can be measured by a capacity-voltage method (CV method). In addition, a carrier concentration measured by a spreading resistance method (SR method) may be used as the net doping concentration. The carrier concentration measured by the CV method or the SR method may be a value in a thermal equilibrium state. In addition, since the donor concentration is sufficiently larger than the acceptor concentration in the N type region, the carrier concentration in the corresponding region may be used as the donor concentration. Similarly, the carrier concentration in the corresponding region in the P type region may be used as the acceptor concentration. In the present specification, the doping concentration of the N type region may be called a donor concentration, and the doping concentration of the P type region may be called an acceptor concentration.

In addition, in a case where the concentration distribution of the donor, the acceptor, or the net doping has a peak, the corresponding peak value may be used as the concentration of the donor, the acceptor, or the net doping in the corresponding region. In a case where the concentration of the donor, the acceptor, or the net doping is substantially uniform or the like, an average value of the concentration of the donor, the acceptor, or the net doping in the corresponding region may be used as the concentration of the donor, the acceptor, or the net doping.

The carrier concentration measured by the SR method may be lower than the concentration of the donor or the acceptor. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of the donor or the acceptor calculated from the carrier concentration measured by the CV method or the SR method may be lower than the chemical concentration of the element indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen. The unit system of the present specification is the SI unit system if there is no particular reference. The unit of length may be displayed in cm or the like, and various calculations may be performed after converting to meters (m).

FIG. 1 is an upper view illustrating an example of a semiconductor device 100 according to an embodiment of the invention. FIG. 1 illustrates positions obtained by projecting each of the members onto the upper surface of a semiconductor substrate 10. In FIG. 1, only some members of the semiconductor device 100 are illustrated, but some members are omitted.

The semiconductor device 100 is provided with the semiconductor substrate 10. The semiconductor substrate 10 includes an edge side 102 when viewed from the upper surface. In the case of simply mentioning "when viewed from the upper surface" in the present specification, it means viewing from the upper surface side of the semiconductor substrate 10. The semiconductor substrate 10 of this example includes two sets of edge sides 102 facing each other when viewed from the upper surface. In FIG. 1, the X axis and the Y axis are parallel with any of the edge sides 102. In addition, the Z axis is perpendicular to the upper surface of the semiconductor substrate 10.

In the semiconductor substrate 10, an active portion 160 is provided. The active portion 160 is a region in which a main current flows in the depth direction, between the upper surface and the lower surface of the semiconductor substrate 10 in a case where the semiconductor device 100 operates. On the upper side of the active portion 160, an emitter electrode is provided, but it is omitted in FIG. 1.

In the active portion 160, there is provided at least one of a transistor portion 70 which includes a transistor element such as an IGBT, and a diode portion 80 which includes a diode element such as a freewheeling diode (FWD). In the example of FIG. 1, the transistor portion 70 and the diode portion 80 are arranged alternately along a predetermined arrangement direction (the X axis direction in this example) in the upper surface of the semiconductor substrate 10. In another example, only one of the transistor portion 70 and the diode portion 80 may be provided in the active portion 160.

In FIG. 1, Symbol "I" is attached to the region where the transistor portion 70 is arranged, and Symbol "F" is attached to the region where the diode portion 80 is arranged. In the present specification, a direction perpendicular to the arrangement direction when viewed from the upper surface may be referred to as a extending direction (the Y axis direction in FIG. 1). The transistor portion 70 and the diode portion 80 may each include a longitudinal side in the extending direction. In other words, the length of the transistor portion 70 in the Y axis direction is larger than the width in the X axis direction. Similarly, the length of the diode portion 80 in the Y axis direction may be larger than the width in the X axis direction. The extending direction of the transistor portion 70 and the diode portion 80 and the longitudinal direction of each trench portion described later may be the same.

The diode portion 80 includes an N+ type cathode region in a region in contact with the lower surface of the semiconductor substrate 10. In the present specification, the region where the cathode region is provided is referred to as the diode portion 80. In other words, the diode portion 80 is a region overlapping with the cathode region when viewed from the upper surface. In the region other than the cathode region of the lower surface of the semiconductor substrate 10, a P+ type collector region may be provided. In the present specification, an extension region 81 extending from the diode portion 80 to a gate runner described later in the Y axis direction may also be included in the diode portion 80. In the lower surface of the extension region 81, a collector region is provided.

The transistor portion 70 includes a P+ type collector region in a region in contact with the lower surface of the semiconductor substrate 10. In addition, in the transistor portion 70, there is periodically provided a gate structure on the upper surface side on the semiconductor substrate 10. The gate structure includes an N type emitter region, a P type base region, a gate conductive portion, and a gate insulating film.

The semiconductor device 100 may include one or more pads on the upper side of the semiconductor substrate 10. The semiconductor device 100 of this example includes a gate pad 112. The semiconductor device 100 may include pads such as an anode pad, a cathode pad, and a current detection pad. Each pad is arranged in the vicinity of the edge side 102. The vicinity of the edge side 102 indicates a region between the edge side 102 and the emitter electrode when viewed from the upper surface. When mounting the semiconductor device 100, each pad may be connected to an external circuit via a wiring such as a wire.

In the gate pad 112, a gate potential is applied. The gate pad 112 is electrically connected to the conductive portion of a gate trench portion of the active portion 160. The semiconductor device 100 is provided with a gate runner to connect the gate pad 112 and the gate trench portion. In FIG. 1, the gate runner is hatched with inclined lines.

The gate runner of this example includes an outer peripheral gate runner 130 and an active-side gate runner 131. The outer peripheral gate runner 130 is arranged between the active portion 160 and the edge side 102 of the semiconductor substrate 10 when viewed from the upper surface. The outer peripheral gate runner 130 of this example surrounds the active portion 160 when viewed from the upper surface. The region surrounding the outer peripheral gate runner 130 when viewed from the upper surface may be called the active portion 160. In addition, the outer peripheral gate runner 130 is connected to the gate pad 112. The outer peripheral gate runner 130 is arranged on the upper side of the semiconductor substrate 10. The outer peripheral gate runner 130 may be a metal wiring containing aluminum or the like.

The active-side gate runner 131 is provided in the active portion 160. With the provision of the active-side gate runner 131 in the active portion 160, it is possible to reduce a variation in wiring length from the gate pad 112 in each region of the semiconductor substrate 10.

The active-side gate runner 131 is connected to the gate trench portion of the active portion 160. The active-side gate runner 131 is arranged on the upper side of the semiconductor substrate 10. The active-side gate runner 131 may be a wiring formed of a semiconductor such as polysilicon doped with an impurity.

The active-side gate runner 131 may be connected to the outer peripheral gate runner 130. The active-side gate runner 131 of this example is provided to extend in the X axis direction from one outer peripheral gate runner 130 up to the other outer peripheral gate runner 130 so as to traverse the active portion 160 in almost the center of the Y axis direction. In a case where the active portion 160 is divided by the active-side gate runner 131, the transistor portion 70 and the diode portion 80 may be alternately arranged in the X axis direction in each divided region.

In addition, the semiconductor device 100 may be provided with a temperature sense portion (not illustrated) which is a PN junction diode formed of polysilicon or the like, and a current detection portion (not illustrated) which simulates the operations of the transistor portion provided in the active portion 160.

The semiconductor device 100 of this example is provided with an edge termination structure portion 90 between the active portion 160 and the edge side 102. The edge termination structure portion 90 of this example is arranged between the outer peripheral gate runner 130 and the edge side 102. The edge termination structure portion 90 relaxes an electric field concentration on the upper surface side of the semiconductor substrate 10. The edge termination structure portion 90 may be further provided with at least one of a guard ring, a field plate, and a RESURF provided annularly around the active portion 160.

Figure 2:
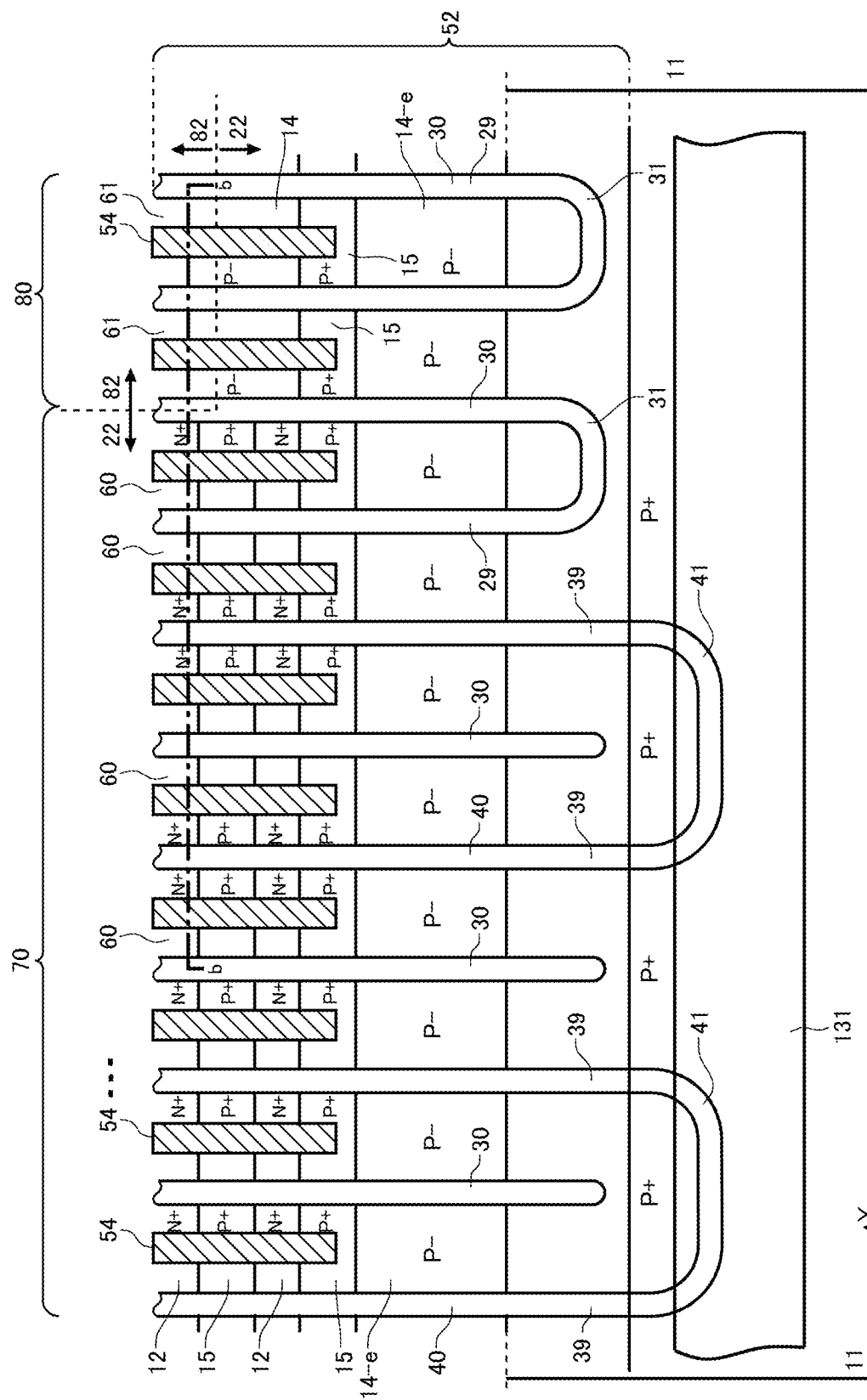
FIG. 2 is an enlarged view of Region A in FIG. 1.

FIG. 2 is an enlarged view of Region A in FIG. 1. Region A is a region where the transistor portion 70, the diode portion 80, and the active-side gate runner 131 are included. The semiconductor device 100 of this example is provided with a gate trench portion 40, a dummy trench portion 30, a well region 11, an emitter region 12, a base region 14, and a contact region 15, which are provided inside the upper surface side of the semiconductor substrate 10. The gate trench portion 40 and the dummy trench portion 30 each are an example of the trench portion. In addition, the semiconductor device 100 of this example is provided with an emitter electrode 52 and the active-side gate runner 131 which are provided on the upper side of the upper surface of the semiconductor substrate 10. The emitter electrode 52 and the active-side gate runner 131 are provided to be separated from each other.

An interlayer dielectric film is provided between the upper surface of the semiconductor substrate 10 and the emitter electrode 52 and the active-side gate runner 131, but is omitted in FIG. 1. In the interlayer dielectric film of this example, a contact hole 54 is provided to pass through the interlayer dielectric film. In FIG. 2, each contact hole 54 is hatched with inclined lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 2 illustrated a range where the emitter electrode 52 is provided. For example, at least a partial region of the emitter electrode 52 is formed of metal such as aluminum, or a metal alloy containing aluminum. The metal alloy is, for example, an aluminum-silicon alloy or an aluminum-silicon-copper alloy. The emitter electrode 52 may have a barrier metal formed of titan or a titan compound in the lower layer of the region formed of aluminum or the like. Further, a plug formed by burying tungsten in the contact hole may be included. The plug is provided to come into contact with the barrier metal and aluminum, or the like.

The well region 11 is provided to be overlapped with the active-side gate runner 131. The well region 11 is provided to extend with a predetermined width even in a range where the active-side gate runner 131 is not overlapped. The well region 11 of this example is provided to be separated from the end of the contact hole 54 in the Y axis direction toward the active-side gate runner 131. The well region 11 is a second conductivity type region in which its doping concentration is higher than that of the base region 14. The base region 14 of this example is a P– type, and the well region 11 is a P+ type.

Each of the transistor portion 70 and the diode portion 80 includes a plurality of trench portions arranged in the arrangement direction. In the transistor portion 70 of this example, one or more gate trench portions 40 and one or more dummy trench portions 30 are alternately provided along the arrangement direction. In the diode portion 80 of this example, the plurality of dummy trench portions 30 are provided along the arrangement direction. In the diode portion 80 of this example, the gate trench portion 40 is not provided.

The gate trench portion 40 of this example may include two linear portions 39 (portions of the trench that are linear along the extending direction) extending along the extending direction perpendicular to the arrangement direction, and the edge portion 41 for connecting the two linear portions 39. The extending direction in FIG. 2 is the Y axis direction.

At least a part of the edge portion 41 is desirably provided in a curved shape when viewed from the upper surface. The ends of two linear portions 39 in the Y axis direction are connected to the edge portion 41, so that the electric field concentration in the end portion of the linear portion 39 can be relaxed.

In the transistor portion 70, the dummy trench portion 30 is provided between the linear portions 39 of the gate trench portion 40. Between the linear portions 39, one dummy trench portion 30 may be provided, or a plurality of dummy trench portions 30 may be provided. The dummy trench portion 30 may be in a linear shape extending in the extending direction, or may include a linear portion 29 and an edge portion 31 similarly to the gate trench portion 40. The semiconductor device 100 illustrated in FIG. 2 includes both the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions of the gate trench portion 40 and the dummy trench portion 30 in the Y axis direction are provided in the well region 11 when viewed from the upper surface. In other words, the bottom of each trench portion in the depth direction is covered with the well region 11 at the end portion of each trench portion in the Y axis direction. With this configuration, the electric field concentration on the bottom of each trench portion can be relaxed.

A mesa portion is provided between the trench portions in the arrangement direction. The mesa portion indicates a region sandwiched between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided to extend in the extending direction (Y axis direction) along the trench portion in the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion indicates each of the mesa portion 60 and the mesa portion 61.

Each mesa portion is provided with the base region 14. In the base region 14 exposed to the upper surface of the semiconductor substrate 10 in the mesa portion, a region arranged nearest to the active-side gate runner 131 is referred to as a base region 14-e. In FIG. 2, the base region 14-e arranged in one end portion in the extending direction of each mesa portion is illustrated. However, the base region 14-e is arranged even the other end portion of each mesa portion. In each mesa portion, at least one of the first conductivity type emitter region 12 and the second conductivity type contact region 15 may be provided in the region sandwiched by the base regions 14-e when viewed from the upper surface. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion in the X axis direction to the other trench portion. As an example, the contact region 15 and the emitter region 12 of the mesa portion 60 are alternately arranged along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

In the mesa portion 61 of the diode portion 80, the emitter region 12 is not provided. In the upper surface of the mesa portion 61, the base region 14 and the contact region 15 may be provided. In the region sandwiched by the base regions 14-e in the upper surface of the mesa portion 61, the contact region 15 may be provided in contact with each base region 14-e. In the region sandwiched by the contact region 15 in the upper surface of the mesa portion 61, the base region 14 may be provided. The base region 14 may be arranged in the entire region sandwiched between the contact regions 15.

On the upper side of each mesa portion, the contact hole 54 is provided. The contact hole 54 is arranged in the region sandwiched by the base regions 14-e. The contact hole 54 of this example is provided on the upper side of each of the contact region 15, the base region 14, and the emitter region 12. The contact hole 54 is not provided in the region corresponding to the base region 14-e and the well region 11. The contact hole 54 may be arranged at the center of the mesa portion 60 in the arrangement direction (X axis direction).

In the diode portion 80, an N+ type cathode region 82 is provided in a region in a direct contact with the lower surface of the semiconductor substrate 10. In the lower surface of the semiconductor substrate 10, a P+ type collector region 22 may be provided in the region where the cathode region 82 is not provided. The cathode region 82 and the collector region 22 are provided between a lower surface 23 and a buffer region 20 described later of the semiconductor substrate 10. In FIG. 2, the boundary between the cathode region 82 and the collector region 22 is illustrated with a dotted line.

The cathode region 82 is arranged separately from the well region 11 in the Y axis direction. With this configuration, the doping concentration is relatively high, and the distance between the P type region (the well region 11) formed up to the deep position and the cathode region 82 is secured, so that the withstand voltage can be improved. The end portion of the cathode region 82 in the Y axis direction of this example is arranged away from the well region 11 than the end portion of the contact hole 54 in the Y axis direction. In another example, the end portion of the cathode region 82 in the Y axis direction may be arranged between the well region 11 and the contact hole 54.

Figure 3:
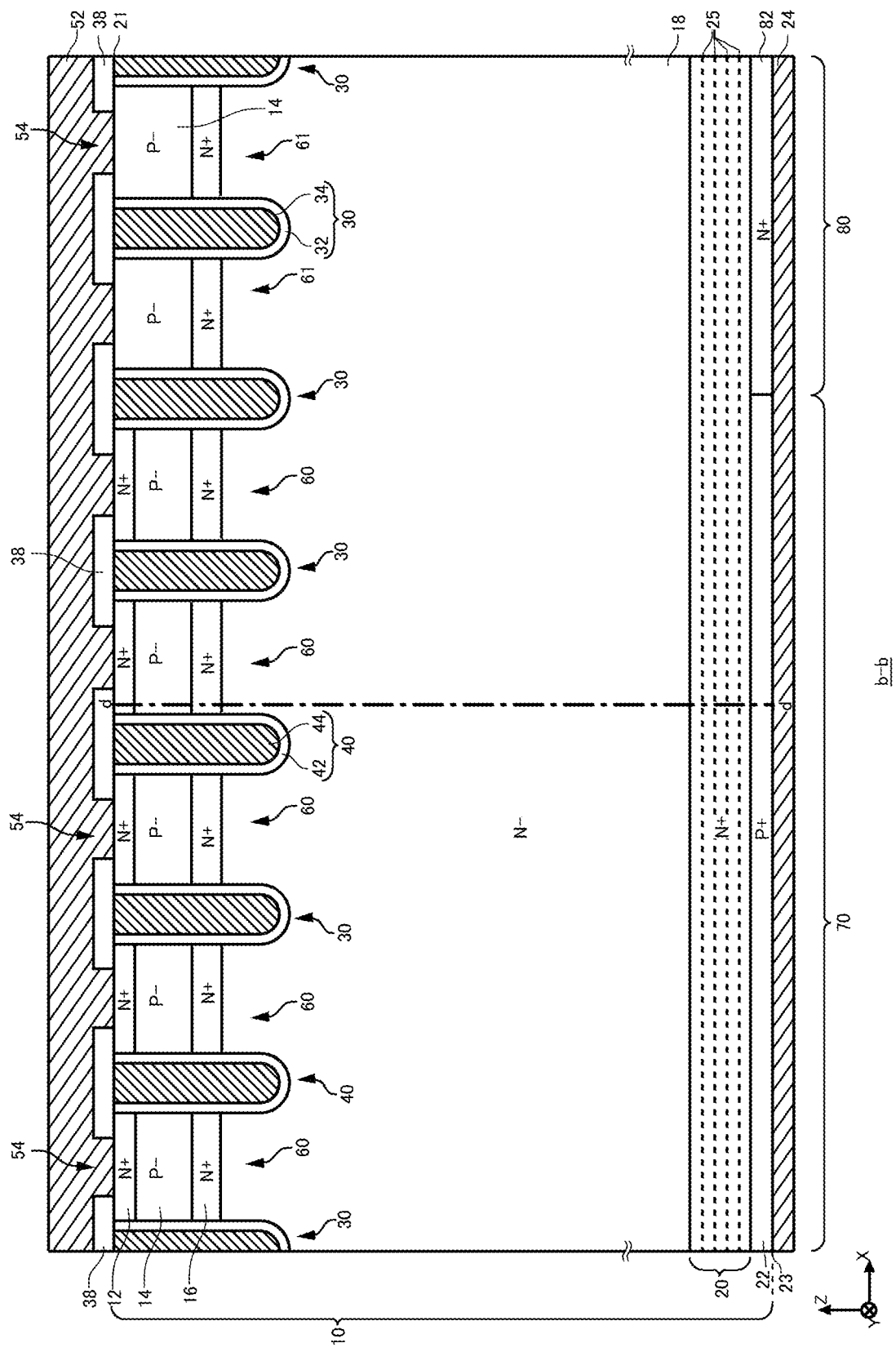
FIG. 3 is a diagram illustrating an example of a b-b cross section in FIG. 2.

FIG. 3 is a diagram illustrating an example of a cross section taken along a line b-b in FIG. 2. The b-b cross section is an XZ plane passing through the emitter region 12 and the cathode region 82. The semiconductor device 100 of this example includes the semiconductor substrate 10, an interlayer dielectric film 38, the emitter electrode 52, and a collector electrode 24 in the corresponding cross section. The interlayer dielectric film 38 is provided in an upper surface 21 of the semiconductor substrate 10. The interlayer dielectric film 38 is a film including at least one of an insulating film such as silicate glass to which an impurity such as boron or phosphorus is added, a thermal oxide film, and another insulating film. In the interlayer dielectric film 38, the contact hole 54 described in FIG. 2 is provided.

The emitter electrode 52 is provided on the upper side of the interlayer dielectric film 38. The emitter electrode 52 passes through the contact hole 54 of the interlayer dielectric film 38 and is in contact with the upper surface 21 of the semiconductor substrate 10. The collector electrode 24 is provided in the lower surface 23 of the semiconductor substrate 10. The emitter electrode 52 and the collector electrode 24 are formed of a metal material such as aluminum or the like. In the present specification, a direction (Z axis direction) connecting the emitter electrode 52 and the collector electrode 24 is referred to as a depth direction.

The semiconductor substrate 10 includes an N− type drift region 18. The drift region 18 is provided in each of the transistor portion 70 and the diode portion 80.

In the mesa portion 60 of the transistor portion 70, the N+ type emitter region 12 and the P− type base region 14 are sequentially provided from the upper surface 21 side of the semiconductor substrate 10. The drift region 18 is provided on the lower side of the base region 14. In the mesa portion 60, an N+ type accumulation region 16 may be provided. The accumulation region 16 is provided between the base region 14 and the drift region 18.

The emitter region 12 is exposed to the upper surface 21 of the semiconductor substrate 10, and is provided in contact with the gate trench portion 40. The emitter region 12 may be in contact with the trench portions on both sides of the mesa portion 60. The emitter region 12 has a doping concentration higher than the drift region 18.

The base region 14 is provided on the lower side of the emitter region 12. The base region 14 of this example is provided in contact with the emitter region 12. The base region 14 may be in contact with the trench portions on both sides of the mesa portion 60.

The accumulation region 16 is provided on the lower side of the base region 14. The accumulation region 16 is an N+ type region having a doping concentration higher than the drift region 18. By providing a highly-concentrated accumulation region 16 between the drift region 18 and the base region 14, it is possible to increase a carrier implantation enhancement effect (IE effect) to lower the ON voltage. The accumulation region 16 may be provided to cover the entire lower surface of the base region 14 in each mesa portion 60.

In the mesa portion 61 of the diode portion 80, a P− type base region 14 is provided in contact with the upper surface 21 of the semiconductor substrate 10. On the lower side of the base region 14, the drift region 18 is provided. In the mesa portion 61, the accumulation region 16 may be provided on the lower side of the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 includes a concentration peak 25 higher than the doping concentration of the drift region 18. The doping concentration of the concentration peak 25 indicates a doping concentration at the apex of the concentration peak 25. In addition, the doping concentration of the drift region 18 may be an average value of the doping concentrations in a region where a doping concentration distribution is almost even. The region where the doping concentration distribution is almost even may be a region where the variation in doping concentration falls within 10%. The buffer region 20 of this example includes three or more concentration peaks 25 in the depth direction (Z axis direction) of the semiconductor substrate 10. The concentration peak 25 of the buffer region 20 may be provided at the same depth position as, for example, the concentration peak of hydrogen (proton) or phosphorus. The buffer region 20 may serve as a field stopper layer which prevents a depletion layer spreading from the lower end of the base region 14 from reaching the P+ type collector region 22 and the N+ type cathode region 82.

In the transistor portion 70, the P+ type collector region 22 is provided below the buffer region 20. The acceptor concentration of the collector region 22 is higher than the acceptor concentration of the base region 14. The collector region 22 may include the same acceptor as the base region 14, or may include a different acceptor. The acceptor of the collector region 22 is, for example, boron.

In the diode portion 80, the N+ type cathode region 82 is provided below the buffer region 20. The donor concentration of the cathode region 82 is higher than the donor concentration of the drift region 18. The donor of the cathode region 82 is, for example, hydrogen or phosphorus. Further, the elements that become donors and acceptors in each region are not limited to the examples described above. The collector region 22 and the cathode region 82 are exposed to the lower surface 23 of the semiconductor substrate 10, and connected to the collector electrode 24. The collector electrode 24 may be in contact with the entire lower surface 23 of the semiconductor substrate 10. The emitter electrode 52 and the collector electrode 24 are formed of a metal material such as aluminum or the like.

On the upper surface 21 side of the semiconductor substrate 10, one or more gate trench portions 40 and one or more dummy trench portions 30 are provided. Each trench portion passes through the base region 14 from the upper surface 21 of the semiconductor substrate 10, and reaches the drift region 18. In the region where at least one of the emitter region 12, the contact region 15, and the accumulation region 16, each trench portion passes through these doping regions and reaches the drift region 18. The configuration that the trench portion passes through the doping region is not limited to the one manufactured in the order of forming the doping region and then forming the trench portion. The configuration that the doping region is formed between the trench portions after forming the trench portion is included in a configuration that the trench portion passes through the doping region.

As described above, the gate trench portion 40 and the dummy trench portion 30 are provided in the transistor portion 70. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate insulating film 42, and a gate conductive portion 44. The gate insulating film 42 is provided to cover the inner wall of the gate trench. The gate insulating film 42 may be formed by oxidizing or nitriding a semiconductor on the inner wall of the gate trench. The gate conductive portion 44 is provided inside from the gate insulating film 42 in the gate trench. In other words, the gate insulating film 42 insulates the gate conductive portion 44 from the semiconductor substrate 10. The gate conductive portion 44 is formed of a conductive material such as polysilicon or the like.

The gate conductive portion 44 may be provided longer than the base region 14 in the depth direction. The gate trench portion 40 in the corresponding cross section is covered by the interlayer dielectric film 38 in the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer at a boundary in contact with the gate trench portion 40 of the base region 14.

The dummy trench portion 30 may have the same structure as the gate trench portion 40 in the corresponding cross section. The dummy trench portion 30 includes a dummy trench, a dummy insulating film 32, and a dummy conductive portion 34 provided in the upper surface 21 of the semiconductor substrate 10. The dummy conductive portion 34 is electrically connected to the emitter electrode 52. The dummy insulating film 32 is provided to cover the inner wall of the dummy trench. The dummy conductive portion 34 is provided in the dummy trench, and is provided inside the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered by the interlayer dielectric film 38 in the upper surface 21 of the semiconductor substrate 10. Further, the bottoms of the dummy trench portion 30 and the gate trench portion 40 may be formed in a curved-surface shape (a curved-line shape in the cross section) convexly downward.

Figure 4:
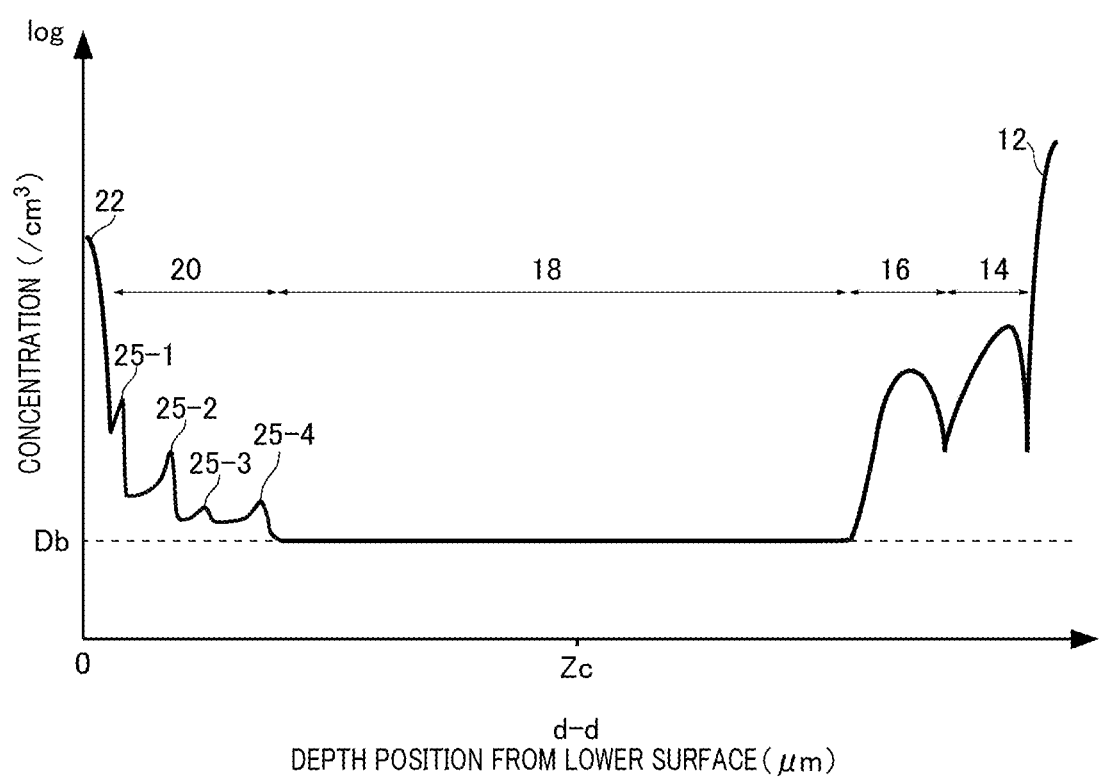
FIG. 4 is a diagram illustrating an example of a doping concentration distribution at a position of line d-d of FIG. 3 in a depth direction.

FIG. 4 is a diagram illustrating an example of a doping concentration distribution at a position of line d-d of FIG. 3 in a depth direction. As described above, the carrier concentration distribution may be used as the doping concentration distribution. The d-d line passes from the emitter region 12 to the collector region 22 in the transistor portion 70. The vertical axis of FIG. 4 represents a logarithmic axis. Further, in FIG. 4 and later, the doping concentration distribution of the buffer region 20 in the transistor portion 70 is described, but the buffer region 20 in the diode portion 80 also has the same doping concentration distribution.

The doping concentration of the drift region 18 of this example is a bulk donor concentration Db. In the semiconductor substrate 10 of this example, the bulk donor of the first conductivity type (N type) is distributed throughout. The bulk donor is a dopant donor substantially uniformly included in an ingot during the production of the ingot from which the semiconductor substrate 10 is made. The bulk donor of this example is an element other than hydrogen. The dopant of the bulk donor is, for example, antimony, arsenic, selenium, or sulfur, but the invention is not limited to these. The bulk donor of this example is phosphorus. The bulk donor is also included in the P type region. The semiconductor substrate 10 may be a wafer sliced out of a semiconductor ingot, or may be a chip obtained by cutting a wafer into individual pieces. The semiconductor ingot may be manufactured by either the Chokralsky method (CZ method), a magnetic field applied Chokralsky method (MCZ method), or a float zone method (FZ method). The ingot in this example is manufactured by the MCZ method. As the bulk donor concentration Db, the chemical concentration of the donor distributed throughout the semiconductor substrate 10 may be used, or a value between 90% to 100% of the chemical concentration may be used.

The doping concentration distribution in the buffer region 20 of this example has three or more concentration peaks 25 provided at different positions in the depth direction. In the example of FIG. 4, four concentration peaks 25-1, 25-2, 25-3, and 25-4 are illustrated, but the number of concentration peaks 25 is not limited to these. In this example, the concentration peak 25 is a peak of the donor concentration. A plurality of concentration peaks 25 can be formed by implanting impurities such as hydrogen or phosphorus to a plurality of depth positions of the buffer region 20. The buffer region 20 may have the concentration peaks of impurities such as hydrogen or phosphorus at the positions corresponding to the concentration peaks 25. The concentration peaks of impurities are peaks in the chemical concentration distribution of the impurities. By provided with the plurality of concentration peaks 25, it is possible to suppress that the depletion layer reaches the collector region 22.

In the buffer region 20 of this example, all the concentration peak 25 are provided on the lower surface 23 side of the semiconductor substrate 10. The lower surface 23 side indicates a region between the lower surface 23 and a center Zc of the semiconductor substrate 10 in the depth direction. In another example, at least one concentration peak 25 may be provided on the upper surface 21 side of the semiconductor substrate 10. The upper surface 21 side indicates a region between the upper surface 21 and the center Zc of the semiconductor substrate 10 in the depth direction.

Figure 5:
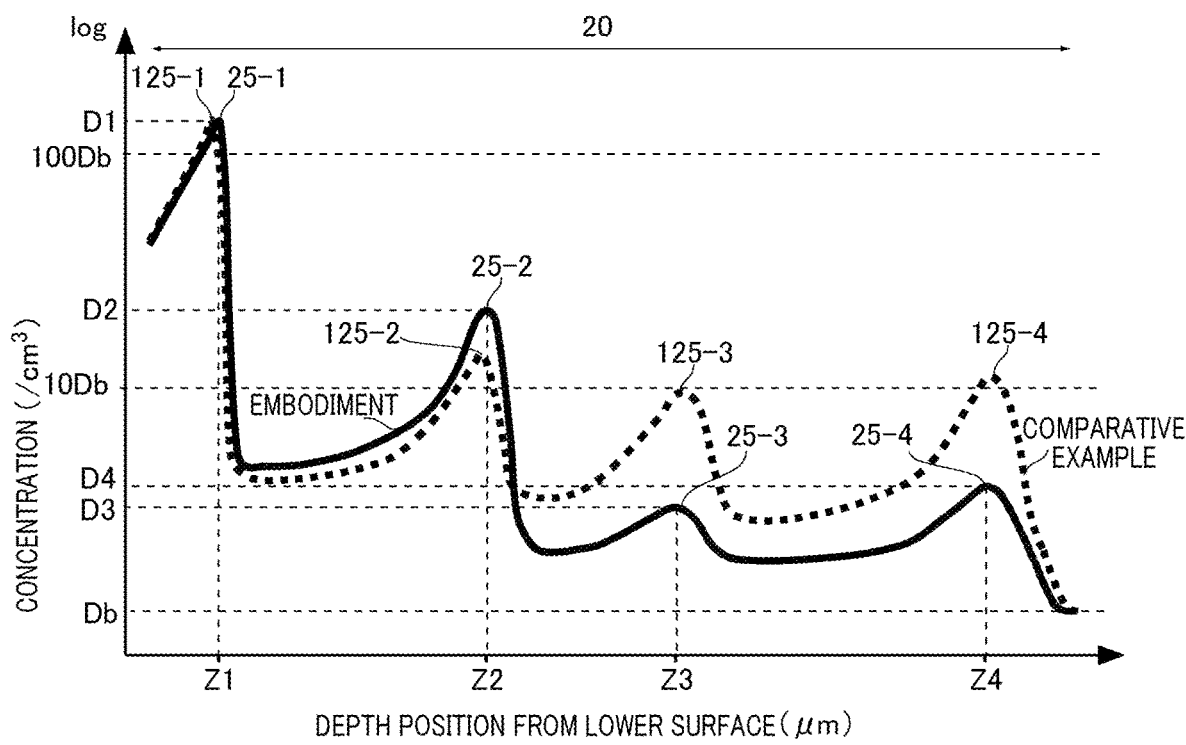
FIG. 5 is an enlarged view of the doping concentration distribution in a buffer region 20.

FIG. 5 is an enlarged view of the doping concentration distribution in the buffer region 20. In FIG. 5, the embodiment related to the semiconductor device 100 is shown using a solid line, and a comparative example is shown using a dashed line. The buffer region 20 according to the embodiment has three or more concentration peaks 25, and the buffer region 20 according to the comparative example has three or more concentration peaks 125.

The plurality of concentration peaks 25 include the shallowest peak closest to the lower surface 23 of the semiconductor substrate 10. In this example, the concentration peak 25-1 corresponds to the shallowest peak. The concentration peak 25-1 of this example is the concentration peak 25 closest to the collector region 22. In the buffer region 20 of the diode portion 80, the concentration peak 25-1 is the concentration peak 25 closest to the cathode region 82. The cathode region 82 may be formed by implanting an impurity different from the concentration peak 25. For example, the cathode region 82 has the concentration peak of an impurity such as phosphorus, and the buffer region 20 has the concentration peak of an impurity such as hydrogen.

The plurality of concentration peaks 25 include a high concentration peak arranged at an upper side than the lower surface 23 than the shallowest peak (concentration peak 25-1). The high concentration peak may be the concentration peak 25-2 closest to the shallowest peak, or may be other concentration peaks 25. In the example of FIG. 5, the concentration peak 25-2 closest to the concentration peak 25-1 corresponds to the high concentration peak.

The plurality of concentration peaks 25 include a low concentration peak which is arranged at an upper side than the lower surface 23 than the high concentration peak, and in which the peak value of the doping concentration is ⅕ or less of the peak value of the high concentration peak. The low concentration peak may be the deepest peak (the concentration peak 25-4 in this example) arranged farthest from the lower surface 23 among the plurality of concentration peaks 25. The low concentration peak may be the concentration peak 25 other than the deepest peak. That is, the low concentration peak may be the concentration peak 25 between the high concentration peak and the deepest peak.

In addition, two or more low concentration peaks may be provided. The low concentration peaks are preferably arranged next to each other in the depth direction. Among the plurality of concentration peaks 25, two or more concentration peaks arranged farthest from the lower surface 23 may be the low concentration peaks. In the example of FIG. 5, the concentration peak 25-4, which is the deepest peak, and the concentration peak 25-3 provided at an upper side than the lower surface 23 next to the deepest peak are the low concentration peaks. In the example of FIG. 5, both a peak value D3 of the doping concentration of the concentration peak 25-3 and a peak value D4 of the doping concentration of the concentration peak 25-4 are 1/5 or less of a peak value D2 of the doping concentration of the concentration peak 25-2.

In a short-circuit state in which two semiconductor devices 100 connected in series are turned on at the same time, a high voltage may be applied between the emitter and the collector of the semiconductor device 100. In this case, the electric field tends to concentrate near the deepest peak (the concentration peak 25-4 and the concentration peak 125-4 in this example) in the buffer region 20. For this reason, if the doping concentration near the deepest peak such as the concentration peak 125-3 and the concentration peak 125-4 is increased, the concentration of the electric field is to be promoted. When the electric field is concentrated, the gate voltage tends to oscillate during the turn-off of the semiconductor device 100.

In the concentration peak 25 of this example, a low concentration peak is provided at a position deeper than the high concentration peak (the concentration peak 25-2) where the doping concentration is sufficiently small. Therefore, the electric field concentration at the deep position in the buffer region 20 can be relaxed. As described above, a plurality of low concentration peaks may be provided. Thereby, the buffer region 20 can be formed at a relatively low concentration on the drift region 18 side. In the example of FIG. 5, the buffer region 20 has two low concentration peaks. However, in another example, the buffer region 20 may have three or more low concentration peaks. In addition, the deepest peak may be provided on the upper surface 21 side of the semiconductor substrate 10. By making the drift region 18 side of the buffer region 20 a low concentration region and forming the low concentration region long in the depth direction, it is easy to maintain a field stop function while relaxing the electric field concentration.

The peak value of the doping concentration of the low concentration peak may be 1/5 or less, 1/10 or less, or 1/20 or less of the peak value of the doping concentration of the high concentration peak. By lowering the doping concentration of the low concentration peak, the electric field concentration can be further relaxed.

In addition, the peak value of the doping concentration of the low concentration peak is higher than the bulk donor concentration Db. The peak value of the doping concentration of the low concentration peak may be 50 times or less of the bulk donor concentration Db of the semiconductor substrate 10. The doping concentration of the drift region 18 may be used as the bulk donor concentration Db. The peak value of the doping concentration of the low concentration peak may be 20 times or less, 10 times or less, 8 times or less, 5 times or less, 3 times or less, or 2 times or less of the bulk donor concentration Db.

The positions of the concentration peaks 25-1, 25-2, 25-3, and 25-4 in the depth direction are Z1, Z2, Z3, and Z4, respectively. The distance between the concentration peak 25-4 and the concentration peak 25-2 in the depth direction is Z4−Z2. In addition, the distance between the concentration peak 25-1 and the concentration peak 25-2 in the depth direction is Z2−Z1. The distance Z4−Z2 may be larger than the distance Z2−Z1. In addition, the distance between the concentration peak 25-3 and the concentration peak 25-4 is Z4−Z3. The distance between the concentration peak 25-3 and the concentration peak 25-2 is Z3−Z2. The distance Z4−Z3 may be larger than the distance Z3−Z2. In addition, the distance Z4−Z3 may be larger than the distance Z2−Z1.

The average value of the peak values of the doping concentrations of the concentration peak 25-4 and the concentration peak 25-3 may be 1/5 or less, 1/10 or less, or 1/20 or less of the peak value of the doping concentration of the high concentration peak. The average value of the peak values of the doping concentration may be an arithmetic average $(D3+D4)/2$, or a geographic average $(D3 \times D4)^{1/2}$. The average value of the peak values of the doping concentrations of the concentration peak 25-4 and the concentration peak 25-3 is higher than the bulk donor concentration Db. The average value of the peak values of the doping concentrations of the concentration peak 25-4 and the concentration peak 25-3 may be 50 times or less, 20 times or less, 10 times or less, 8 times or less, 5 times or less, 3 times or less, or 2 times or less of the bulk donor concentration Db. By reducing the average value of the doping concentrations of two deepest concentration peaks 25, the electric field concentration in the buffer region 20 near the drift region 18 can be relaxed.

Figure 6:
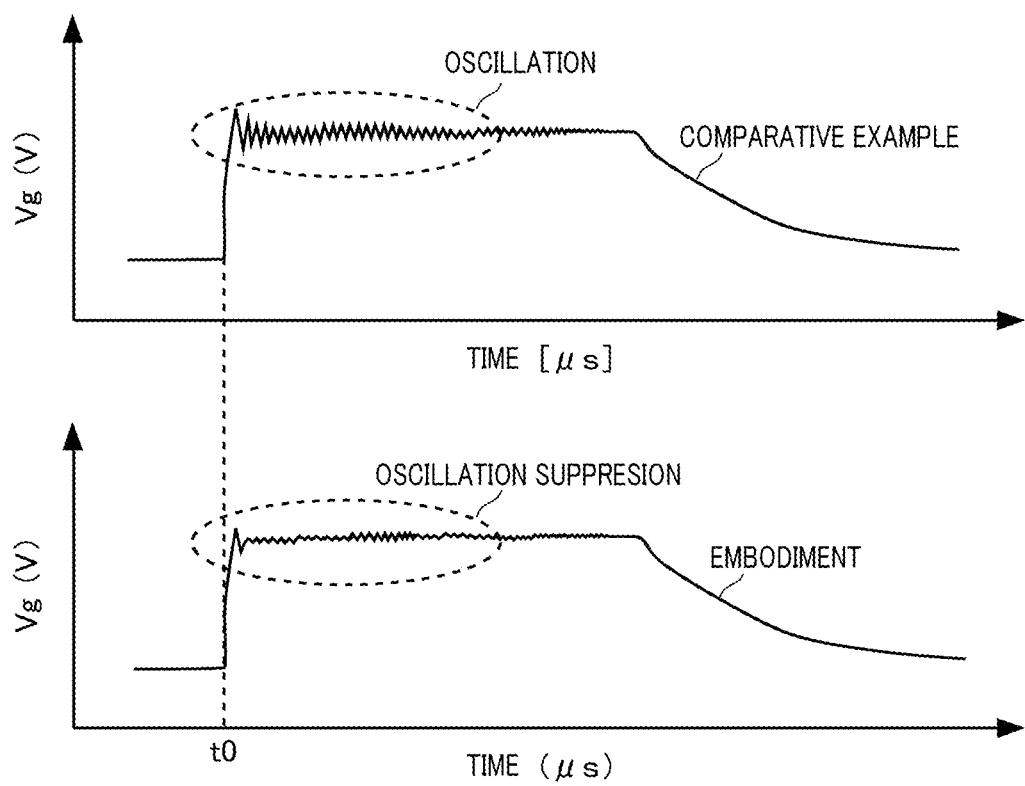

FIG. 6 is a diagram illustrating an example of a gate voltage waveform when the semiconductor device 100 in the short-circuit state is turned on. In FIG. 6, the comparative example and the embodiment are illustrated. The comparative example and the embodiment each have the doping concentration distribution illustrated in FIG. 5. The structure other than the doping concentration distribution of the buffer region 20 is the same in the comparative example and the embodiment. In this example, 200 V is applied between the emitter electrode 52 and the collector electrode 24.

In the comparative example, oscillation occurs immediately after the gate voltage rises at time to. As illustrated in FIG. 5, this is considered that the oscillation is caused by the high doping concentrations of the concentration peak 125-4 and the concentration peak 125-3, and by the concentration of the electric field on a portion on the drift region 18 side of the buffer region 20. On the contrary, in the embodiment, it can be seen that the oscillation in the gate voltage is suppressed.

Figure 7:
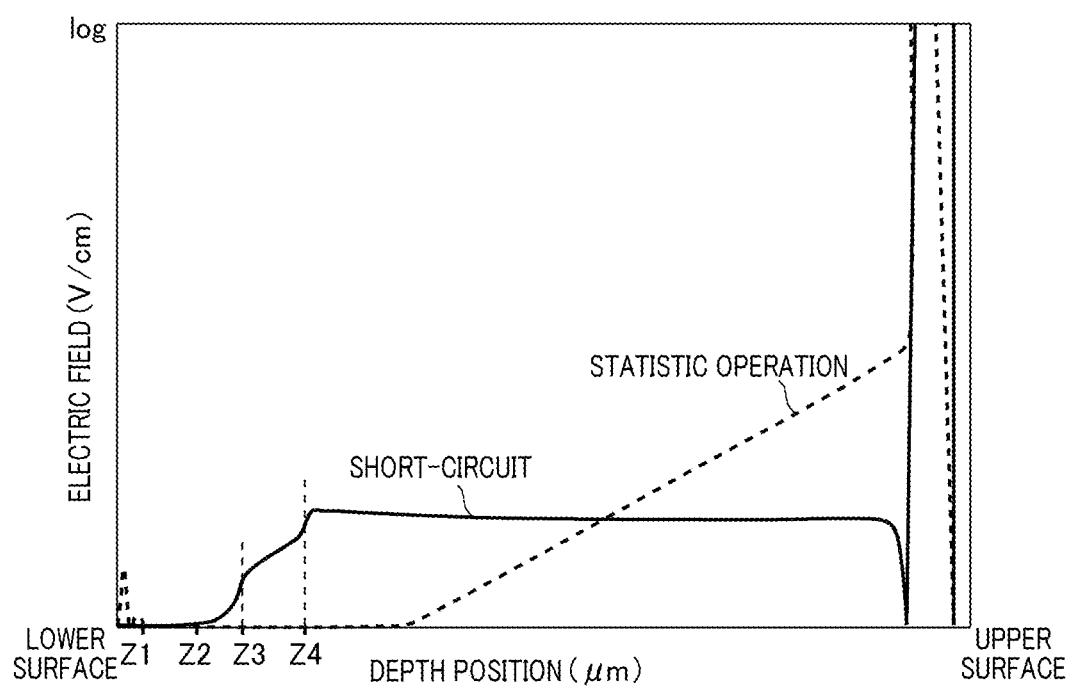
FIG. 7 is a diagram illustrating an example of an electric field distribution in the depth direction of a semiconductor substrate 10 according to an embodiment.

FIG. 7 is a diagram illustrating an example of an electric field distribution of the semiconductor substrate 10 in the depth direction according to the embodiment. In the semiconductor substrate 10 of this example, 200 V is applied between the emitter electrode 52 and the collector electrode 24. In addition, FIG. 7 illustrates the electric field distribution in the short-circuit state of the semiconductor device 100 and the electric field distribution during a static operation (for example, a state where the voltage and the current are stabilized after switching).

The electric field strength distribution in the static state gradually decreases from the upper surface 21 side to the lower surface 23 side. In the static state, the depletion layer does not spread to a position Z4 of the deepest peak of the buffer region 20.

On the other hand, since the concentrations of electrons and holes are almost equal, the electric field strength distribution in the short-circuit state increases slightly from the upper surface 21 side to the position Z4, and has an electric field peak near the position Z4. In the short-circuit state, the depletion layer spreads to the vicinity of the position Z2.

Figure 8:
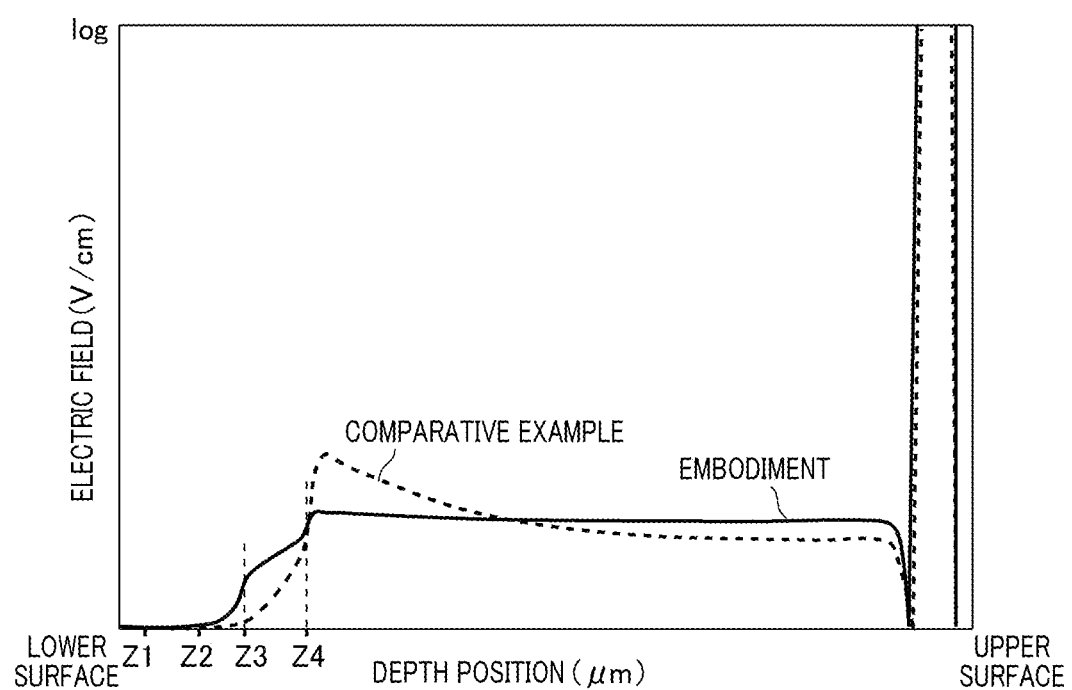
FIG. 8 is a diagram illustrating an example of an electric field strength distribution in the short-circuit state in an embodiment and a comparative example.

FIG. 8 is a diagram illustrating an example of the electric field strength distribution in the short-circuit state in the embodiment and the comparative example. The electric field strength distribution of the embodiment is the same as in the example illustrated in FIG. 7. In the comparative example, as illustrated in FIG. 5, the doping concentration of the concentration peak 125-4 is relatively high. For this reason, in the comparative example, the concentration of holes implanted from the collector region 22 is relatively low compared to the concentration of electrons, and the electric field peak near the position Z4 becomes large. In addition, the electric field on the upper surface 21 side becomes small. As a result, as illustrated in FIG. 6, vibrations are caused in the gate voltage waveform of the comparative example. In the embodiment, the electric field peak near the position Z4 can be relaxed. In addition, the electric field strength distribution becomes nearly uniform from the upper surface 21 side to the position Z4. Therefore, as illustrated in FIG. 6, the vibrations in the gate voltage waveform can be suppressed.

Figure 9:
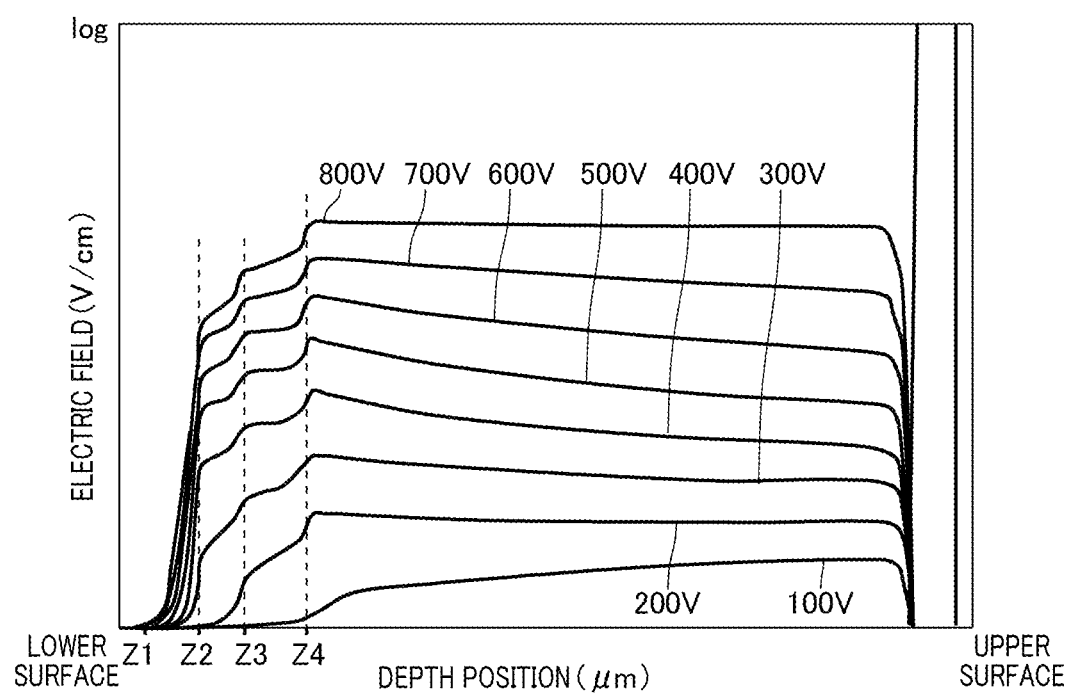
FIG. 9 is a diagram illustrating the electric field distribution of the semiconductor device 100 according to an embodiment for each voltage applied between an emitter and a collector.

FIG. 9 is a diagram illustrating the electric field distribution of the semiconductor device 100 according to the embodiment for each voltage applied between the emitter and the collector. In this example, the voltage between emitter and collector is increased by 100 V from 100 V to 800 V. In any example, the difference between the electric field strength near the position Z4 and the electric field strength on the upper surface 21 side becomes small. Thereby, the oscillation of the gate voltage can be suppressed.

Figure 10:
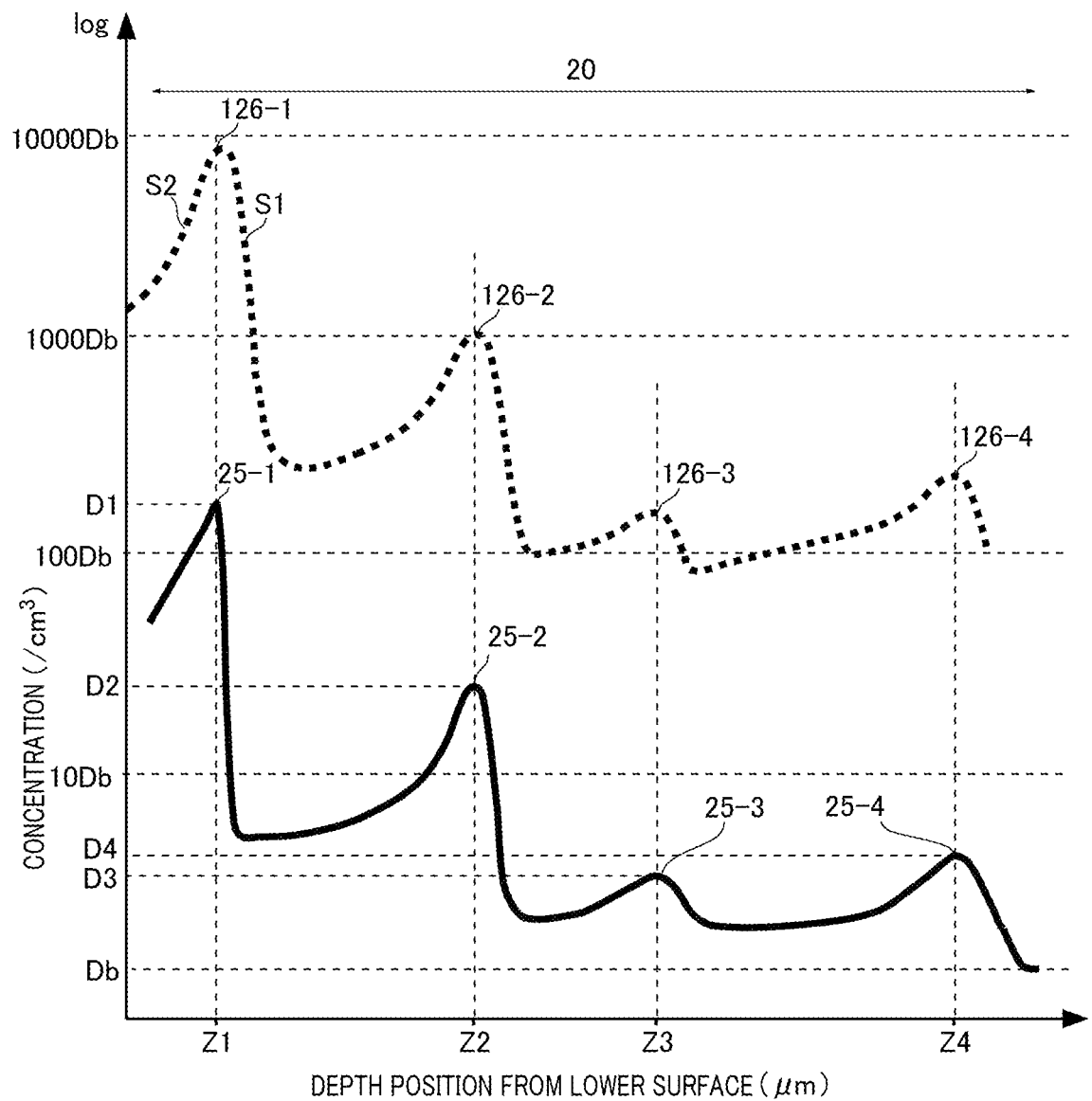
FIG. 10 is a diagram illustrating an example of a chemical concentration distribution of hydrogen in the buffer region 20.

FIG. 10 is a diagram illustrating an example of the chemical concentration distribution of hydrogen in the buffer region 20. Each concentration peak 25 in this example is formed by implanting hydrogen ions such as protons from the lower surface 23 side. In this case, the buffer region 20 includes a hydrogen concentration peak 126 at the depth position corresponding to each concentration peak 25. The corresponding depth positions of two peaks indicate, for example, that the apex of the other peak is arranged within the full width half maximum range of one peak. The number of concentration peaks 25 in the buffer region 20 and the number of hydrogen concentration peaks 126 may be the same.

In this example, the hydrogen ions are implanted from the lower surface 23 side of the semiconductor substrate 10. Therefore, in the hydrogen concentration distribution, a tail s2 extending from the apex of each hydrogen concentration peak 126 to the lower surface 23 side is smoother than a tail S1 extending from the apex of each hydrogen concentration peak 126 to the upper surface 21 side. That is, the tail S2 has a smaller inclination than the tail S1.

In the region through which hydrogen ions implanted from the lower surface 23 pass, lattice defects mainly composed of vacancies such as monoatomic vacancies (V), divacancies (VV), or the like are formed. Atoms in a direct contact with vacancies have a dangling bond. The lattice defect also includes interstitial atoms, dislocates, or the like, and in a broader way donors and acceptors can also be included. However, in the present specification, the lattice defect mainly composed of vacancies may be called a vacancy lattice defect, a vacancy defect, or simply a lattice defect. In addition, since a large number of lattice defects are formed due to the implantation of hydrogen ions into the semiconductor substrate 10, the crystallinity of the semiconductor substrate 10 may be strongly disturbed. In the present specification, the crystallinity disturbance may be called a disorder. In addition, hydrogen (H) implanted into the buffer region 20, a vacancy (V), and oxygen (O) are combined to form a VOH defect. Further, hydrogen is diffused by thermal annealing, and thus the formation of the VOH defect is promoted. The VOH defect functions as a donor which supplies electrons.

Due to the formation of the VOH defect, the doping concentration also tends to increase between two concentration peaks 25. Therefore, even if the concentration peak 25 includes the low concentration peak, it is easy to make the region between the concentration peaks 25 a higher concentration than the drift region 18. In the present specification, the VOH defect may be simply called a hydrogen donor. In the buffer region 20 of this example, the hydrogen donor is included. The hydrogen donor may also be included in the region between two concentration peaks 25. The doping concentration of the hydrogen donor is lower than the chemical concentration of hydrogen. When the ratio of the doping concentration of the hydrogen donor to the chemical concentration of hydrogen is an activation rate, the activation rate may be a value of 0.1% to 30%. In this example, the activation rate is 1% to 5%.

Figure 11:
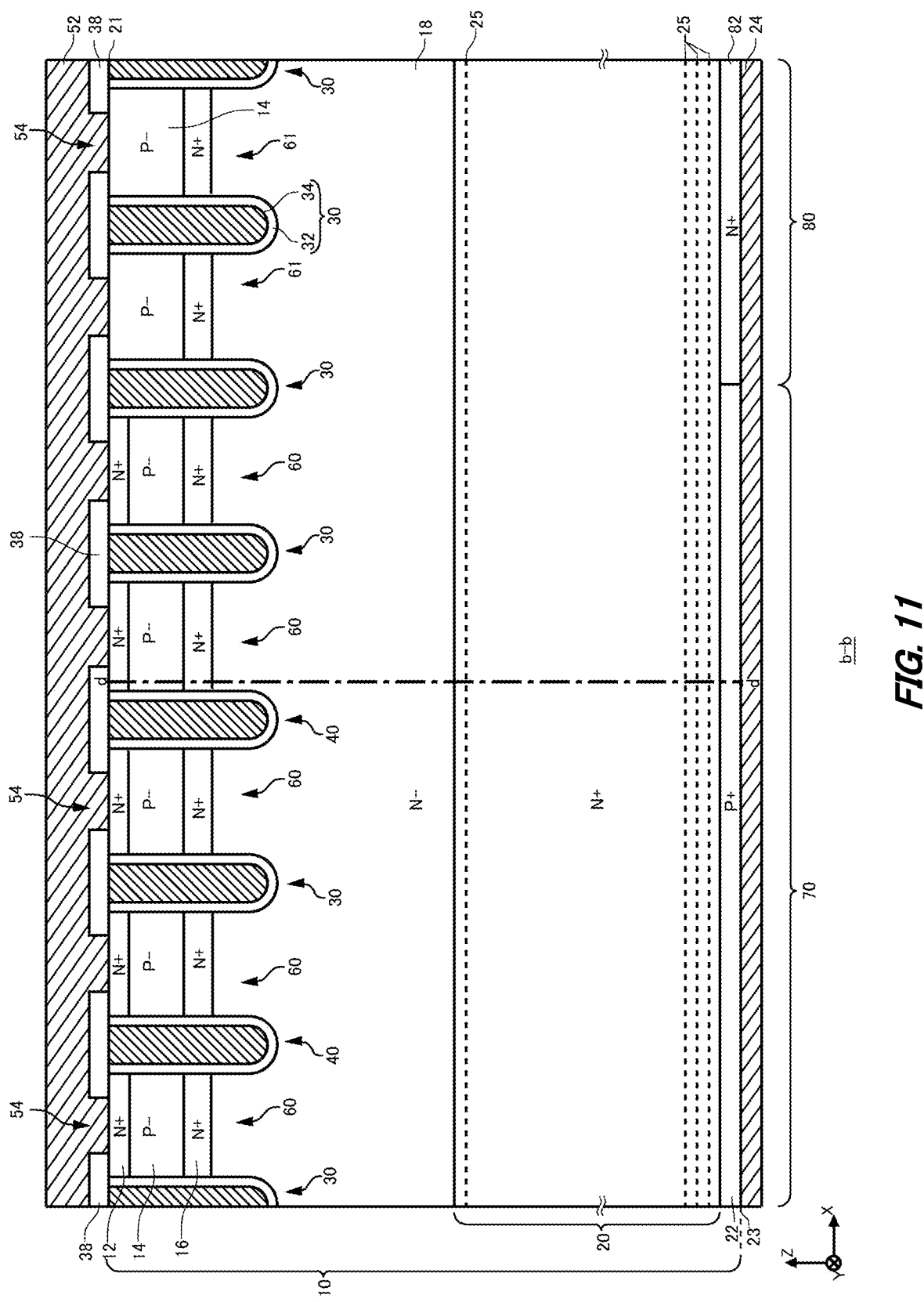
FIG. 11 is a diagram illustrating another example of the b-b cross section of the semiconductor device 100.

FIG. 11 is a diagram illustrating another example of the b-b cross section of the semiconductor device 100. The semiconductor device 100 of this example is different from the example illustrated in FIG. 3 in length of the buffer region 20 and the drift region 18 in the depth direction. The other structures are the same as in the example of FIG. 3.

A part of the buffer region 20 of this example is arranged on the upper surface 21 side of the semiconductor substrate 10. For example, at least the deepest peak among the plurality of concentration peaks 25 is arranged on the upper surface 21 side. The remaining concentration peak 25 is arranged on the lower surface 23 side of the semiconductor substrate 10 as in the example of FIG. 3.

Figure 12:
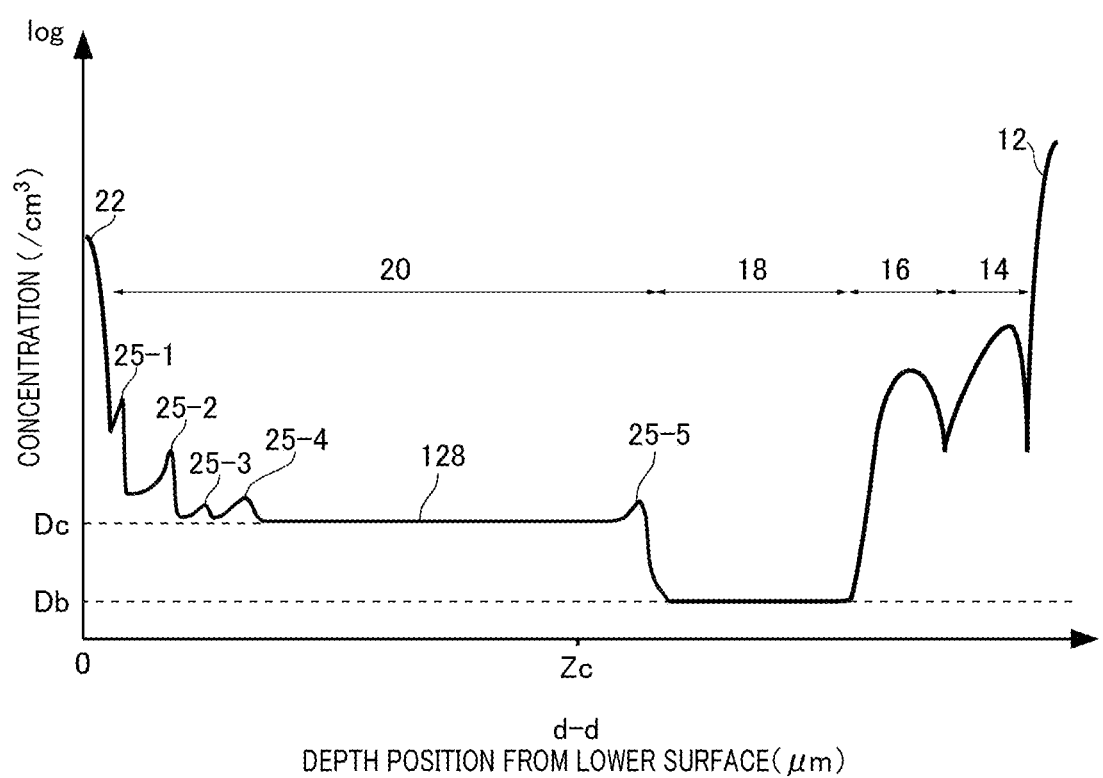
FIG. 12 is a diagram illustrating an example of the doping concentration distribution in line d-d of FIG. 11.

FIG. 12 is a diagram illustrating of an example of the doping concentration distribution in d-d line of FIG. 11. The doping concentration distribution of this example is different from the example illustrated in FIG. 4 in length of the buffer region 20 and the drift region 18 in the depth direction. The other regions are the same as in the example of FIG. 4.

In the buffer region 20 of this example, the concentration peak 25-5 which is the deepest peak is arranged on the upper surface 21 side of the semiconductor substrate 10. In addition, the concentration peak 25-4 may be arranged on the lower surface 23 side of the semiconductor substrate 10. A highly concentrated region 128, which has a higher doping concentration than the drift region 18, is provided between the concentration peak 25-5 and the concentration peak 25-4. The highly concentrated region 128 may be a region where the doping concentration distribution is flat. As described above, the VOH defect is formed between two concentration peaks 25 by implanting hydrogen ions to form the concentration peaks 25. Therefore, the highly concentrated region 128 can be formed between the concentration peak 25-5 and the concentration peak 25-4.

Also in this example, the doping concentration of the low concentration peak is the same as in the examples described in FIGS. 4 and 5. The concentration peak 25-5 may be a low concentration peak. The concentration peak 25-4 may also be a low concentration peak.

In this example, the doping concentration in the center Zc of the semiconductor substrate 10 in the depth direction is Dc. The center Zc is included in the highly concentrated region 128. The doping concentration Dc is higher than the bulk doping concentration Db. The peak value of the doping concentration of the low concentration peak of this example may be 50 times or less, 20 times or less, 10 times or less, 8 times or less, 5 times or less, 3 times or less, or 2 times or less of the doping concentration Dc. Further, the average value of the peak values of the doping concentrations of the concentration peak 25-5 and the concentration peak 25-4 may be 50 times or less, 20 times or less, 10 times or less, 8 times or less, 5 times or less, 3 times or less, or 2 times or less of the doping concentration Dc.

Figure 13:
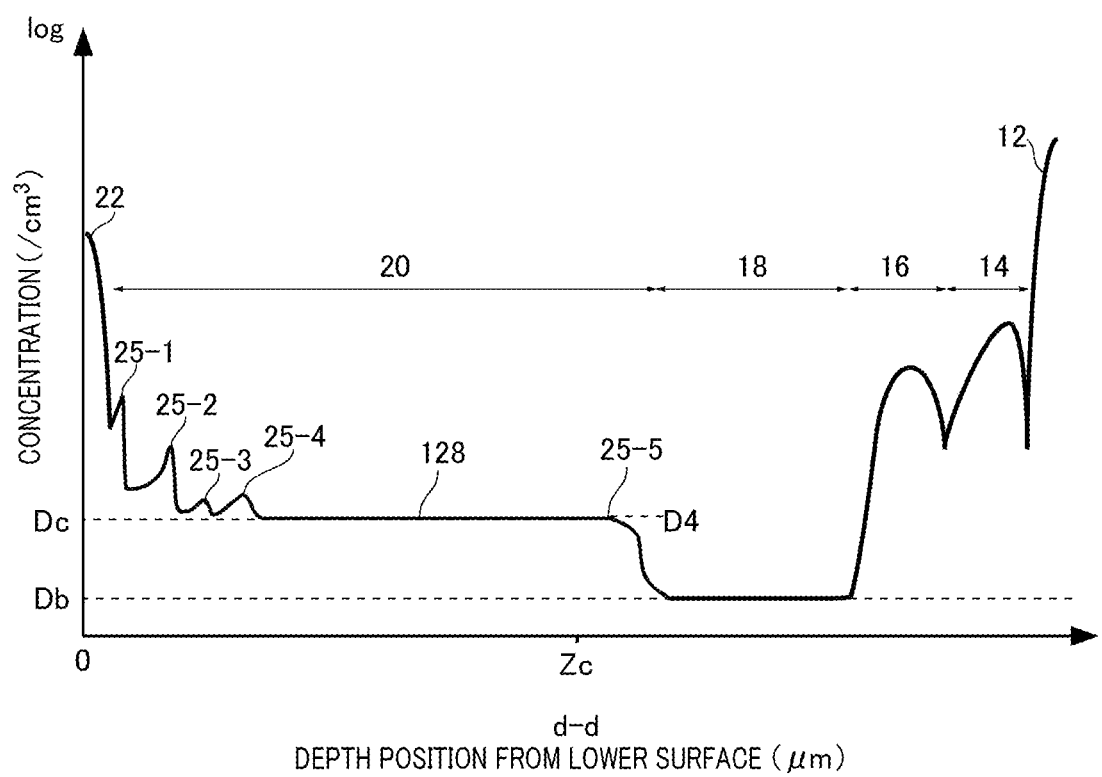
FIG. 13 is a diagram illustrating another example of the doping concentration distribution in line d-d of FIG. 11.

FIG. 13 is a diagram illustrating another example of the doping concentration distribution in line d-d of FIG. 11. The doping concentration distribution of this example is different from the example of FIG. 12 in the shape of the concentration peak 25-5. The other distributions are the same as in the example of FIG. 12.

In this example, the concentration peak 25-5 does not have a clear mountain shape. For example, the highly concentrated region 128 may have a doping concentration distribution that increases almost constantly or slightly from the lower surface 23 side to the upper surface 21 side. The doping concentration distribution decreases from the doping concentration of the highly concentrated region 128 to the doping concentration of the drift region 18 in the upper surface 21 side of the semiconductor substrate 10. In this example, the maximum value of the doping concentration of the buffer region 20 on the upper surface 21 side of the semiconductor substrate 10 may be set as the doping concentration D4 of the concentration peak 25-5. Also in this example, the concentration peak 25-5 may be the low concentration peak. The concentration peak 25-4 may also be a low concentration peak.

Figure 14:
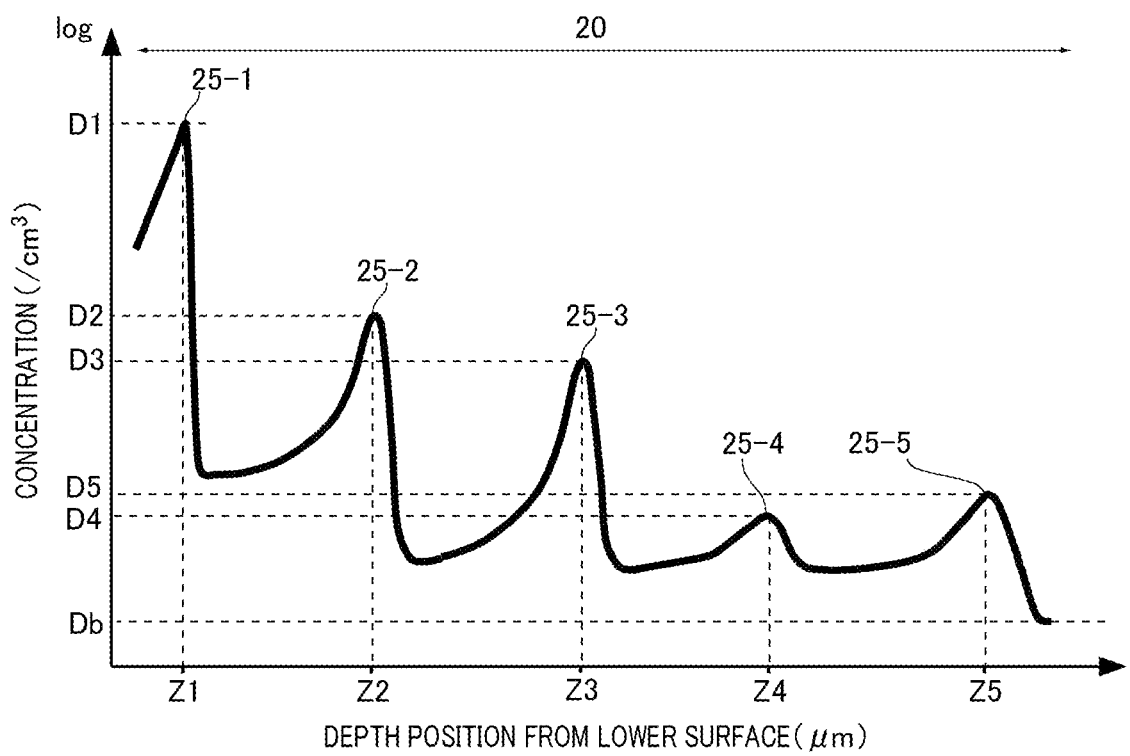
FIG. 14 is a diagram illustrating another example of the doping concentration distribution in the buffer region 20.

FIG. 14 is a diagram illustrating another example of the doping concentration distribution in the buffer region 20. The buffer region 20 of this example includes 5 or more concentration peaks 25. Among the concentration peaks 25, the average value of the peak values of two doping concentrations of the concentration peak 25-2 and the concentration peak 25-3 closest to the shallowest peak 25-1 is set to Da1. Among the concentration peaks 25, the average value of the peak values of two doping concentrations of the concentration peak 25-4 and the concentration peak 25-5 which are arranged farthest from the lower surface 23 is set to Da2. Either average value may be an arithmetic average or a geographic average.

The average value Da2 may be 1/5 or less of the average value Da1, 1/10 or less, or 1/20 or less. The average value Da2 may be 50 times or less, 20 times or less, 10 times or less, 8 times or less, 5 times or less, 3 times or less, or 2 times or less of the bulk donor concentration Db. Such a structure can also relax the electric field concentration on the buffer region 20 near the drift region 18.

Figure 15:
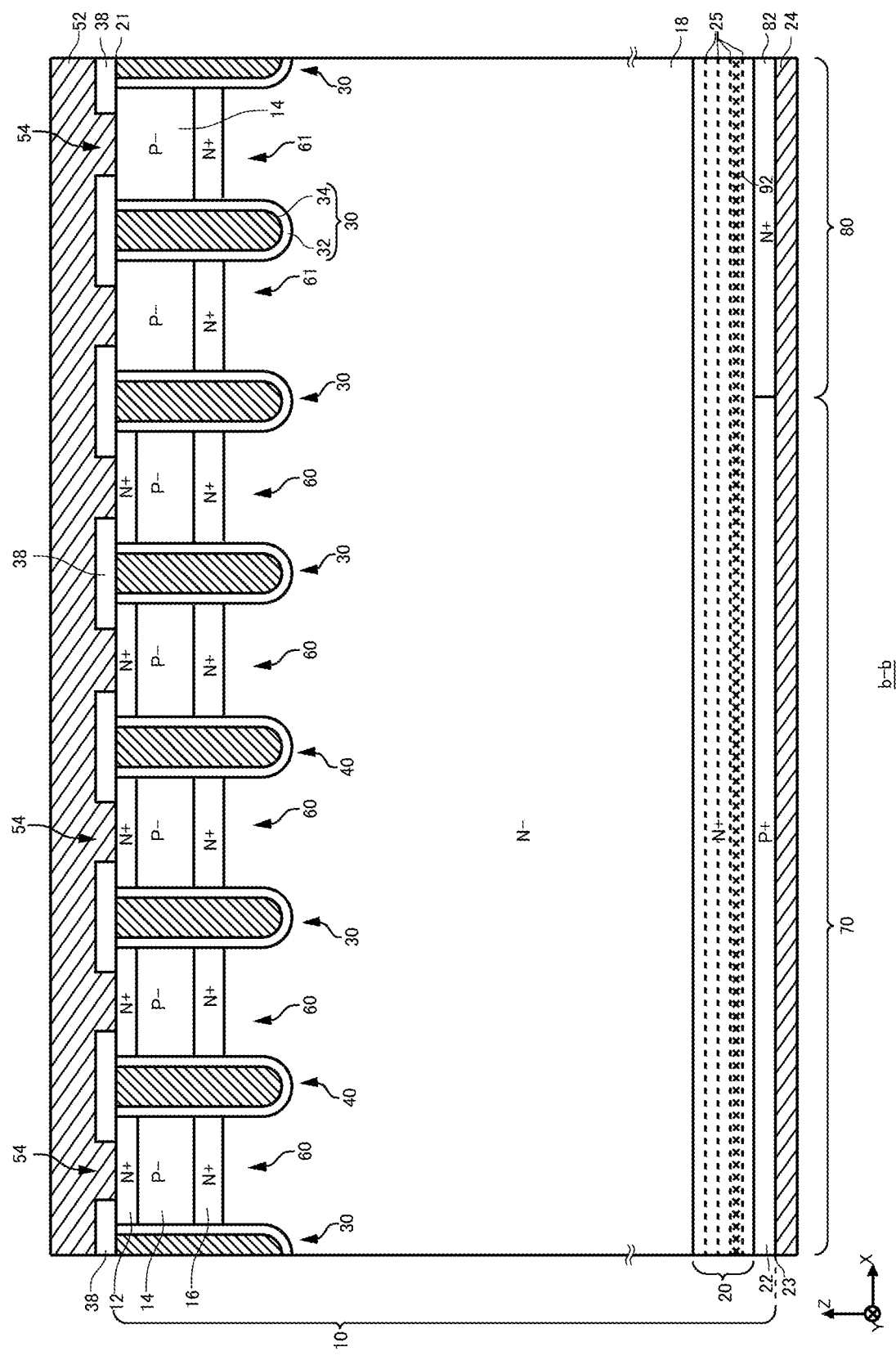
FIG. 15 is a diagram illustrating another example of the b-b cross section of the semiconductor device 100.

FIG. 15 is a diagram illustrating another example of the b-b cross section of the semiconductor device 100. The semiconductor device 100 of this example further includes a lifetime control region 92 for the semiconductor device 100 described in FIGS. 1 to 14. The other structures are the same as any semiconductor device 100 described in FIGS. 1 to 14.

The lifetime control region 92 is a region where the concentration of the recombination center of carriers (electrons or holes) is set to be higher than that of the surrounding. In FIG. 15, the recombination center is schematically marked with symbol x. The recombination center may be vacancies or a lattice defect mainly composed of vacancies such as double vacancies, may be dislocation, may be interstitial atoms, or may be transition metal or the like. The lifetime control region 92 of this example is provided in the buffer region 20. The lifetime control region 92 may be provided in either the transistor portion 70 or the diode portion 80.

The lifetime control region 92 can be formed, for example, by irradiating charged particles such as helium from the lower surface 23 to the buffer region 20. The recombination center of the carrier is formed at high density in the vicinity of the range of the charged particles such as helium.

Since the recombination center in the lifetime control region 92 and the carrier are combined, the lifetime of the carrier near the lifetime control region 92 is lowered. Thereby, the switching time such as turn-off of the semiconductor device 100 is reduced, and the switching loss can be reduced.

Figure 16:
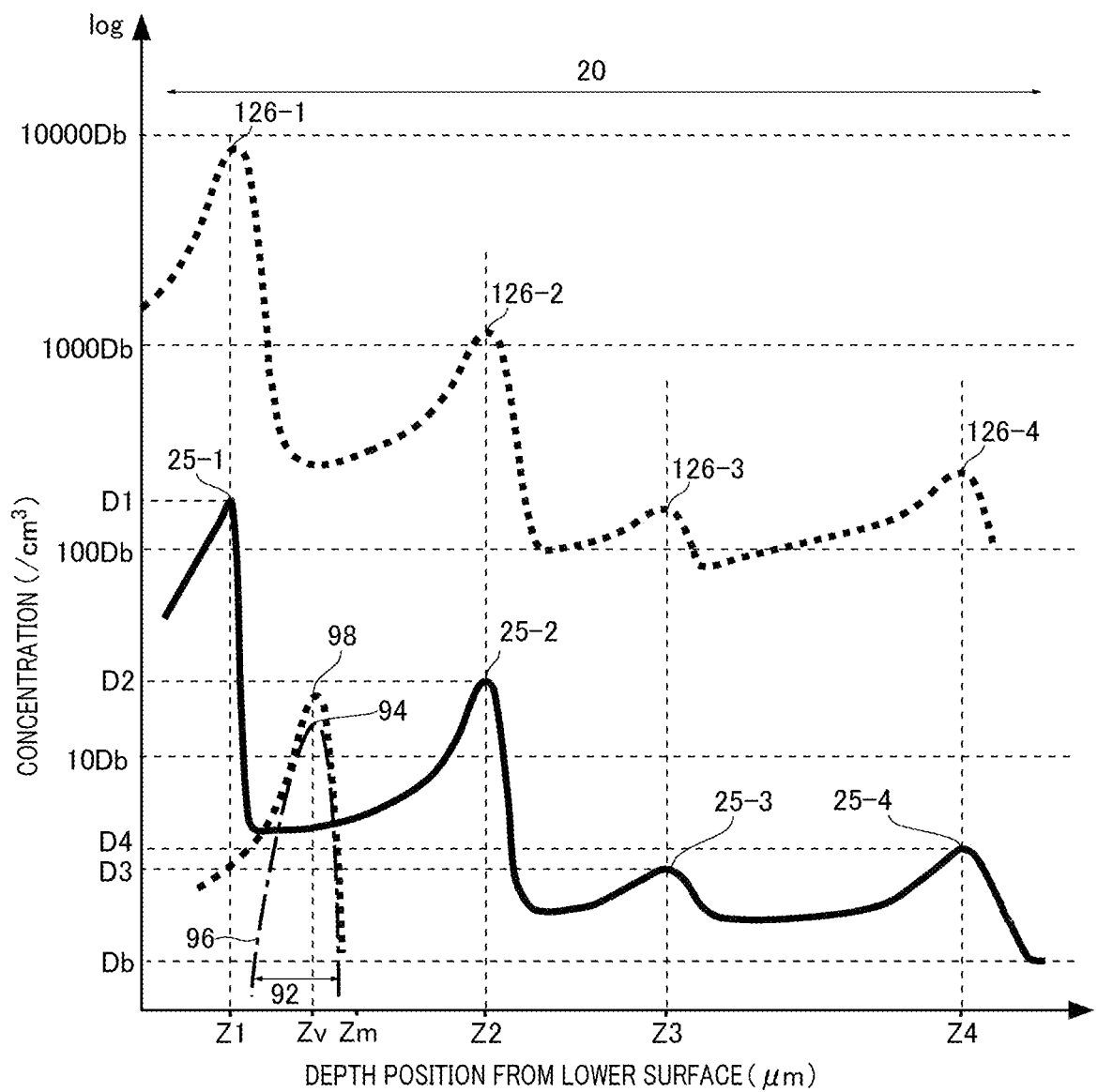
FIG. 16 is a diagram illustrating an example of the doping concentration distribution in the buffer region 20 illustrated in FIG. 15.

FIG. 16 is a diagram illustrating an example of the doping concentration distribution in the buffer region 20 illustrated in FIG. 15. The doping concentration distribution in the buffer region 20 is the same as the example illustrated in FIG. 10. In FIG. 16, the chemical concentration distribution of hydrogen and helium and a density distribution 96 of the recombination center are schematically illustrated. The chemical concentration distribution of hydrogen has a plurality of hydrogen concentration peaks 126 similarly to the example illustrated in FIG. 10. In the present specification, the recombination center may be a lattice defect mainly composed of vacancies.

The density distribution 96 of the recombination center has a density peak 94. The depth position of the density peak 94 is set to Zv. The particles (for example, helium) other than hydrogen forming the recombination center may also have a concentration peak 98 at the same depth position of the density peak 94. In vacancies closed to the hydrogen concentration peak 126, the dangling bond is ended with hydrogen. Therefore, the width of the density distribution 96 of the recombination center in the Z axis direction is narrower than the width of the helium concentration distribution in the Z axis direction. As the width of each distribution, a full width half maximum (FWHM) may be used.

The density peak 94 of this example is arranged between the concentration peak 25-1, which is the shallowest peak, and the concentration peak 25-2 which is the high concentration peak. The recombination center is formed in a region through which particles such as helium pass. When the density peak 94 is provided between the high concentration peak 25-2 and the low concentration peak 25-3 or 25-4, the depletion layer reaches the density peak 94, and the leakage current may increase.

On the other hand, by providing the lifetime control region 92 on the lower surface 23 side than the high concentration peak, it is possible to prevent that the depletion layer reaches the lifetime control region 92, or even if it reaches, the overlapping with the depletion layer is slight, so that the increase in leakage current can be suppressed.

Further, the high concentration peak and the shallowest peak are formed by implanting a high concentration of hydrogen ions. Therefore, even if the particles such as helium are implanted between the high concentration peak and the shallowest peak, the doping concentration of the corresponding region greatly depends on the hydrogen concentration, and is less susceptible to the concentration such as helium. In this example, the dose amount of hydrogen ions for the high concentration peak (the concentration peak 25-2) is 10 times or more than the dose amount of particles such as helium. The dose amount of hydrogen ions may be 20 times or more than the dose amount of particles such as helium, or may be 50 times or more.

Further, since the lattice defect in the density peak 94 becomes a VOH defect, a minute concentration peak may appear at a position corresponding to the density peak 94 in the doping concentration distribution. However, the hydrogen concentration peak 126 is not provided at the same depth position as the minute hydrogen concentration peak.

The central position between the concentration peak 25-1 and the concentration peak 25-2 in the depth direction is set to Zm. The position Zv of the density peak 94 may be arranged between the position Z1 and the position Zm. That is, the density peak 94 may be arranged between the shallowest peak and the high concentration peak from the shallowest peak. Thereby, the increase in the doping concentration on the upper surface 21 side can be further suppressed from the high concentration peak by irradiating helium.

In each example described in FIGS. 1 to 16, the peak value of the doping concentration of the deepest peak (the concentration peak 25-4 in FIG. 16) among the concentration peaks 25 may be 1.1 times or more than the peak value of the doping concentration of the concentration peak 25 (the concentration peak 25-3 in FIG. 16) adjacent to the deepest peak in the depth direction, or may be 5 times or less. That is, the deepest peak has a slightly higher doping concentration than the adjacent concentration peak 25. Thereby, a large number of lattice defects are formed between the deepest peak and the adjacent concentration peak 25. Therefore, the doping concentration of the corresponding region can be increased. Thereby, it is possible to suppress that the depletion layer spreading from the lower end of the base region 14 reaches a region on the lower surface 23 side of the buffer region 20. Therefore, surges and the like during switching operation can be suppressed.

For example, the peak value of the doping concentration of the deepest peak is $1.0 \times 10^{14}$ atoms/cm$^3$ or more, and $5.0 \times 10^{14}$ atoms/cm$^3$ or less. The peak value of the doping concentration of the deepest peak may be $2.0 \times 10^{14}$ atoms/cm$^3$ or more. In addition, the peak value of the doping concentration of the deepest peak may be $4.0 \times 10^{14}$ atoms/cm$^3$ or less.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate; 11: well region; 12: emitter region; 14: base region; 15: contact region; 16: accumulation region; 18: drift region; 20: buffer region; 21: upper surface; 22: collector region; 23: lower surface; 24: collector electrode; 25: concentration peak; 29: linear portion; 30: dummy trench portion; 31: end portion; 32: dummy insulating film 34: dummy conductive portion 38: interlayer dielectric film; 39: linear portion; 40: gate trench portion; 41: edge portion; 42: gate insulating film; 44: gate conductive portion; 52: emitter electrode; 54: contact hole; 60, 61: mesa portion; 70: transistor portion; 80: diode portion 81: extension region 82: cathode region; 90: edge termination structure portion; 92: lifetime control region; 94: density peak; 96: density distribution; 98: concentration peak; 100: semiconductor device; 102: edge side; 112: gate pad; 125: concentration peak; 126: hydrogen concentration peak; 128: highly concentrated region; 130: outer peripheral gate runner; 131: active-side gate runner; 160: active portion

What is claimed is:

1. A semiconductor device, comprising:
    a drift region of a first conductivity type which is provided in a semiconductor substrate; and
    a buffer region of the first conductivity type which is provided between the drift region and a lower surface of the semiconductor substrate, and has three or more concentration peaks higher than a doping concentration of the drift region of the semiconductor substrate in a depth direction,
    wherein three or more of the concentration peaks includes
    a shallowest peak closest to the lower surface of the semiconductor substrate,
    a high concentration peak arranged at an upper side than the lower surface of the semiconductor substrate than the shallowest peak, and
    one or more low concentration peaks which are arranged at an upper side than the lower surface of the semiconductor substrate than the high concentration peak; and of which the doping concentration is ⅕ or less of the high concentration peak; and
    wherein
    the three or more of the concentration peaks include two or more of the low concentration peaks, and
    the shallowest peak has a doping concentration higher than the high concentration peak.

2. The semiconductor device according to claim 1,
    wherein the buffer region has a hydrogen concentration peak corresponding to the concentration peak.

3. The semiconductor device according to claim 1, further comprising:
    a collector region of a second conductivity type which is provided between the buffer region and the lower surface of the semiconductor substrate.

4. The semiconductor device according to claim 1,
    wherein the low concentration peak is a deepest peak which is arranged farthest from the lower surface of the semiconductor substrate among the concentration peaks.

5. The semiconductor device according to claim 1,
    wherein the three or more of the concentration peaks include a deepest peak arranged farthest from the lower surface of the semiconductor substrate, and
    wherein the low concentration peak is arranged between the high concentration peak and the deepest peak.

6. The semiconductor device according to claim 1,
    wherein two or more of the low concentration peaks are two or more of the concentration peaks arranged farthest from the lower surface of the semiconductor substrate among the concentration peaks.

7. The semiconductor device according to claim 1,
    wherein the doping concentration of the low concentration peak is 50 times or less of a bulk donor concentration of the semiconductor substrate.

8. The semiconductor device according to claim 1,
    wherein the doping concentration of the low concentration peak is 50 times or less of the doping concentration in a center of the semiconductor substrate in the depth direction.

9. The semiconductor device according to claim 1,
    wherein the three or more of the concentration peaks include a first peak which is arranged farthest from the lower surface of the semiconductor substrate and a second peak which is adjacent to the first peak in the depth direction, and
    wherein an average value of peak values of the doping concentrations of the first peak and the second peak is ⅕ or less of a peak value of the doping concentration of the high concentration peak.

10. The semiconductor device according to claim 9,
wherein an average value of peak values of the doping concentrations of the first peak and the second peak is 50 times or less of a bulk donor concentration of the semiconductor substrate.

11. The semiconductor device according to claim 9,
wherein an average value of peak values of the doping concentrations of the first peak and the second peak is 50 times or less of the doping concentration in a center of the semiconductor substrate in the depth direction.

12. The semiconductor device according to claim 1,
wherein the buffer region includes a recombination center, and wherein a density peak of the recombination center in the depth direction is arranged between the shallowest peak and the high concentration peak.

13. The semiconductor device according to claim 12,
wherein the density peak is arranged between the shallowest peak and the high concentration peak from the shallowest peak.

14. The semiconductor device according to claim 1,
wherein the doping concentration of a deepest peak arranged farthest from the lower surface of the semiconductor substrate among the concentration peaks is 1.1 times or more than the doping concentration of the concentration peak adjacent to the deepest peak in the depth direction, or 5 times or less.

15. The semiconductor device according to claim 1,
wherein the doping concentration of a deepest peak arranged farthest from the lower surface of the semiconductor substrate among the concentration peaks is $1.0 \times 10^{14}$ atoms/cm$^3$ or more, and $5.0 \times 10^{14}$ atoms/cm$^3$ or less.

16. The semiconductor device according to claim 1,
wherein the buffer region is arranged between the lower surface of the semiconductor substrate and a center of the semiconductor substrate in the depth direction.

17. The semiconductor device according to claim 1,
wherein a deepest peak arranged farthest from the lower surface of the semiconductor substrate among the concentration peaks is arranged between an upper surface of the semiconductor substrate and a center of the semiconductor substrate in the depth direction.

18. The semiconductor device according to claim 1,
wherein the low concentration peak and the high concentration peak are arranged to be adjacent in the depth direction.

19. The semiconductor device according to claim 1,
wherein the three or more concentration peaks include a first peak arranged farthest from the lower surface of the semiconductor substrate and a second peak adjacent to the first peak in the depth direction, and
wherein a highly concentrated region where a doping concentration is higher than the drift region and a doping concentration distribution is almost flat is provided between the first peak and the second peak.

20. The semiconductor device according to claim 19,
wherein the highly concentrated region includes a center of the semiconductor substrate in the depth direction.

21. The semiconductor device according to claim 19,
wherein the first peak is the low concentration peak.

* * * * *